(12) United States Patent
Lee et al.

(10) Patent No.: US 11,903,184 B2
(45) Date of Patent: Feb. 13, 2024

(54) SEMICONDUCTOR MEMORY DEVICES AND METHODS FOR FABRICATING THE SAME

(71) Applicant: Samsung Electronics Co., Ltd., Suwon-si (KR)

(72) Inventors: Kyung Hwan Lee, Seoul (KR); Yong Seok Kim, Suwon-si (KR); Il Gweon Kim, Hwaseong-si (KR); Hui-Jung Kim, Seongnam-si (KR); Min Hee Cho, Suwon-si (KR); Jae Ho Hong, Hwaseong-si (KR)

(73) Assignee: Samsung Electronics Co., Ltd.

( * ) Notice: Subject to any disclaimer, the term of this patent is extended or adjusted under 35 U.S.C. 154(b) by 374 days.

(21) Appl. No.: 17/392,488

(22) Filed: Aug. 3, 2021

(65) Prior Publication Data

US 2022/0199625 A1 Jun. 23, 2022

(30) Foreign Application Priority Data

Dec. 22, 2020 (KR) ........................ 10-2020-0180502

(51) Int. Cl.
| | | |
|---|---|---|
| *H01L 27/108* | (2006.01) | |
| *H01L 29/24* | (2006.01) | |
| *H10B 12/00* | (2023.01) | |
| *G11C 11/402* | (2006.01) | |

(52) U.S. Cl.
CPC .......... *H10B 12/34* (2023.02); *G11C 11/4023* (2013.01); *H01L 29/24* (2013.01)

(58) Field of Classification Search
CPC ........... H01L 29/66833; H01L 29/7813; H01L 27/11597; H01L 29/4236; H10B 12/00; H10B 12/30; H10B 12/395; H10B 12/377; H10B 12/31; H10B 12/033
See application file for complete search history.

(56) References Cited

U.S. PATENT DOCUMENTS

| | | | |
|---|---|---|---|
| 9,177,872 B2 | 11/2015 | Sandhu | |
| 9,698,272 B1 | 7/2017 | Ikeda et al. | |
| 10,714,400 B2 | 7/2020 | Torek | |
| 2015/0340367 A1* | 11/2015 | Manabe | ............... H01L 29/4236 257/334 |
| 2019/0296155 A1 | 9/2019 | Sawabe et al. | |
| 2019/0393222 A1 | 12/2019 | Sharma et al. | |
| 2020/0006575 A1 | 1/2020 | Dewey et al. | |
| 2020/0083225 A1 | 3/2020 | Ma et al. | |
| 2020/0227416 A1 | 7/2020 | Lilak et al. | |

* cited by examiner

*Primary Examiner* — Selim U Ahmed
(74) *Attorney, Agent, or Firm* — Myers Bigel, P.A.

(57) ABSTRACT

A semiconductor memory device in which performance and reliability are improved, and a method for fabricating the same are provided. The semiconductor memory device includes a conductive line extending in a first direction on a substrate, an interlayer insulation film that includes a cell trench extending in a second direction intersecting the first direction, on the substrate, a first gate electrode and a second gate electrode that are spaced apart from each other in the first direction and each extend in the second direction, inside the cell trench, a channel layer that is inside the cell trench and is electrically connected to the conductive line, on the first gate electrode and the second gate electrode, and a gate insulation layer interposed between the first gate electrode and the channel layer, and between the second gate electrode and the channel layer.

20 Claims, 27 Drawing Sheets

SEMICONDUCTOR MEMORY DEVICES AND METHODS FOR FABRICATING THE SAME

CROSS-REFERENCE TO RELATED APPLICATION

This application claims priority to Korean Patent Application No. 10-2020-0180502, filed on Dec. 22, 2020, and all the benefits accruing therefrom under 35 U.S.C. § 119, the disclosure of which is incorporated herein by reference in its entirety.

BACKGROUND

The present disclosure relates to semiconductor memory devices. A semiconductor memory device may include a vertical channel transistor (VCT).

To satisfy consumer demand for excellent performance and low price, it may be advantageous to increase the degree of integration of a semiconductor memory device. In the case of the semiconductor memory device, because the degree of integration is an important factor in determining the price of the product, an increased density may be particularly advantageous.

In the case of a two-dimensional or planar semiconductor memory device, the degree of integration is mainly determined by an area occupied by a unit memory cell, and is therefore greatly affected by the level of fine pattern forming technology. However, since ultra-expensive apparatuses may be used for miniaturization of the pattern, the degree of integration of two-dimensional semiconductor memory device may increase but still be limited. Accordingly, semiconductor memory devices including a VCT whose channel extends in a vertical direction are proposed.

SUMMARY

Aspects of the present inventive concept provide a semiconductor memory device in which performance and reliability are improved.

Aspects of the present inventive concept also provide a method for fabricating a semiconductor memory device in which performance and reliability are improved.

However, aspects of the present inventive concept are not restricted to the examples set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a semiconductor memory device comprising a conductive line extending in a first direction on a substrate, an interlayer insulation film that includes a cell trench extending in a second direction intersecting the first direction, on the substrate, a first gate electrode and a second gate electrode that are spaced apart from each other in the first direction and each extend in the second direction, inside the cell trench, a channel layer that is inside the cell trench and is electrically connected to the conductive line, on the first gate electrode and the second gate electrode, and a gate insulation layer interposed between the first gate electrode and the channel layer, and between the second gate electrode and the channel layer.

According to an aspect of the present inventive concept, there is provided a semiconductor memory device comprising a conductive line extending in a first direction, on a substrate, an interlayer insulation film that includes a cell trench extending in a second direction intersecting the first direction, on the substrate, a first gate electrode and a second gate electrode that are spaced apart from each other in the first direction and each extend in the second direction, inside the cell trench, a separation trench that overlaps the conductive line and extends in the second direction to separate the first gate electrode and the second gate electrode, a channel layer that extends along the first gate electrode and the second gate electrode and through the separation trench to electrically connect to the conductive line, and a gate insulation layer interposed between the first gate electrode and the channel layer, and between the second gate electrode and the channel layer.

According to an aspect of the present inventive concept, there is provided a semiconductor memory device comprising a bit line extending in a first direction on a substrate, a first interlayer insulation film that includes a cell trench extending in a second direction intersecting the first direction, on the substrate, a first word line and a second word line that are spaced apart from each other in the first direction and each extend in the second direction, inside the cell trench, a channel layer that is inside the cell trench, is electrically connected to the bit line, and includes an oxide semiconductor material, on the first word line and the second word line, a gate insulation layer interposed between the first word line and the channel layer, and between the second word line and the channel layer, a first capacitor structure electrically connected to a first end of the channel layer adjacent to the first word line, and a second capacitor structure electrically connected an opposite, second end of the channel layer adjacent to the second word line.

According to an aspect of the present inventive concept, there is provided a method for fabricating a semiconductor memory device, the method comprising forming a conductive line extending in a first direction, on a substrate, forming an interlayer insulation film that is on the conductive line, forming a cell trench extending in a second direction intersecting the first direction, inside the interlayer insulation film, forming a preliminary gate electrode layer extending in the second direction, inside the cell trench, cutting the preliminary gate electrode layer to form a first gate electrode and a second gate electrode spaced apart from each other in the first direction, forming a gate insulation layer on the first gate electrode and the second gate electrode, and forming a channel layer electrically connected to the conductive line, on the gate insulation layer.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION

Hereinafter, a semiconductor memory device according to example embodiments will be described referring to FIGS. 1 to 12.

Figure 1:
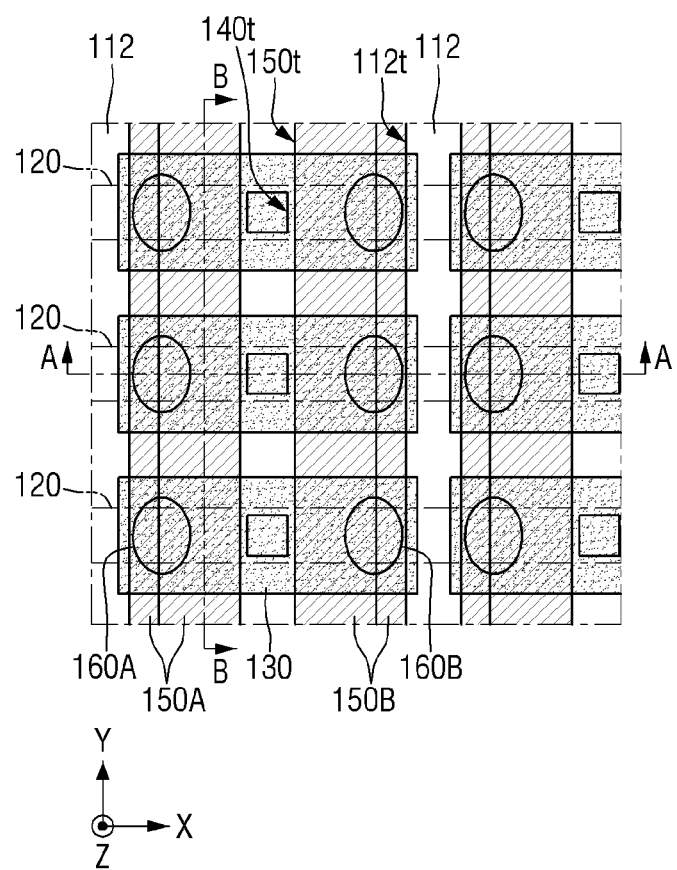
FIG. 1 is a schematic layout diagram for explaining a semiconductor memory device according to some embodiments.
Figure 2:
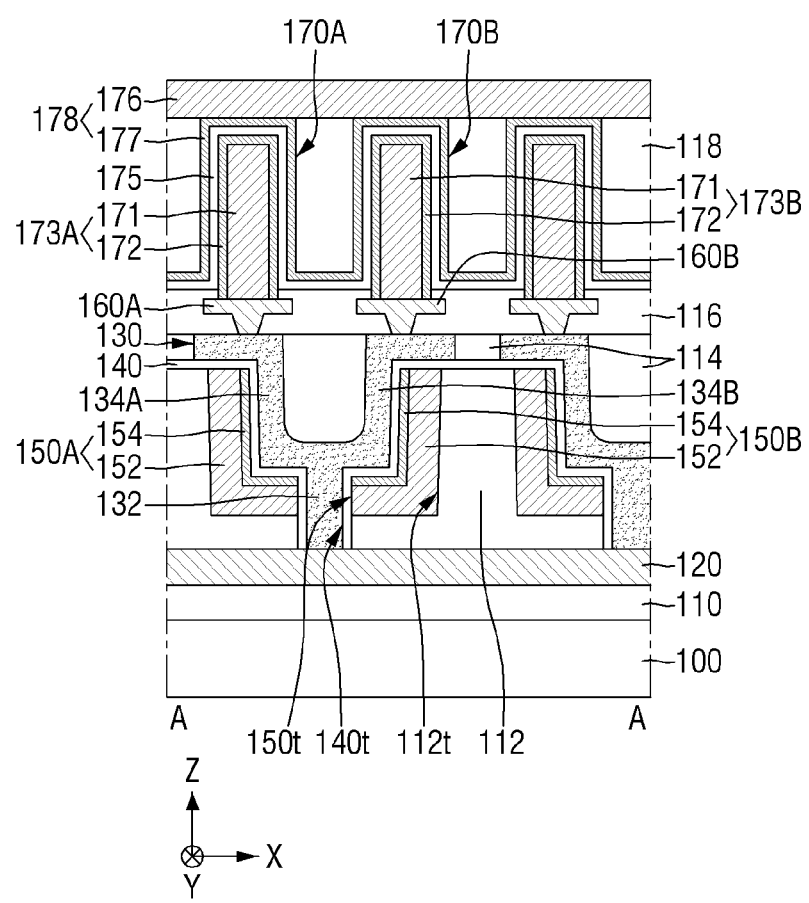
FIG. 2 is a cross-sectional view taken along line A-A of FIG. 1.
Figure 3:
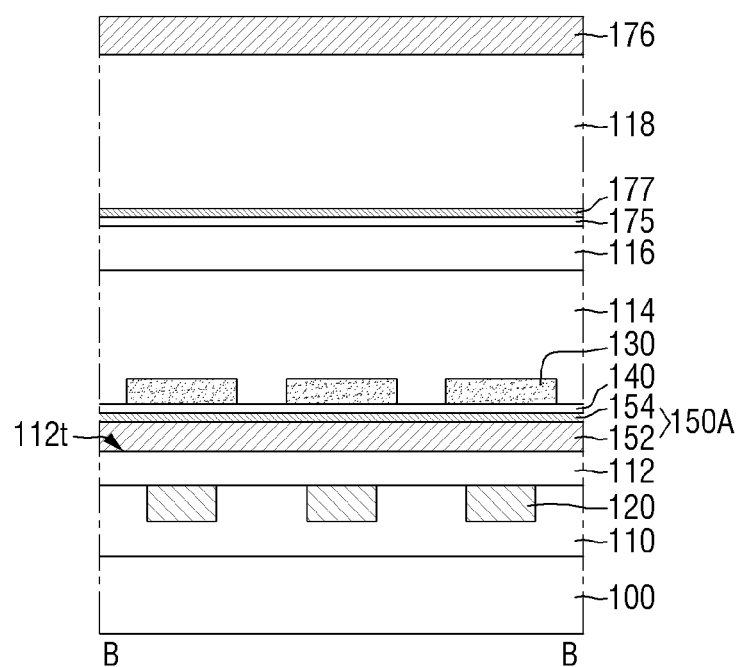
FIG. 3 is a cross-sectional view taken along line B-B of FIG. 1.

FIG. 1 is a schematic layout diagram for explaining a semiconductor memory device according to some embodiments. FIG. 2 is a cross-sectional view taken along line A-A of FIG. 1. FIG. 3 is a cross-sectional view taken along line B-B of FIG. 1.

Referring to FIGS. 1 to 3, the semiconductor memory device according to some embodiments includes a first substrate 100, a conductive line 120, a first interlayer insulation film 112, gate electrodes 150A and 150B, a gate insulation layer 140, a channel layer 130, a second interlayer insulation film 114, landing pads 160A and 160B, and capacitor structures 170A and 170B.

Although the first substrate 100 may have a structure in which a base substrate and an epitaxial layer are stacked, the present disclosure is not limited thereto. The first substrate 100 may be a silicon substrate, a gallium arsenide substrate, a silicon germanium substrate, or an SOI (Semiconductor On Insulator) substrate.

The conductive line 120 may be formed on the first substrate 100. For example, a lower insulation film 110 may be formed on the first substrate 100, and the conductive line 120 may be placed on the lower insulation film 110. The conductive line 120 may extend long in a first direction X. The plurality of conductive lines 120 each extend in the first direction X and may be spaced apart from each other at equal intervals in a second direction Y that intersects the first direction X. The lower insulation film 110 may be formed in (e.g., to fill) a space between the conductive lines 120. In some embodiments, an upper surface of the lower insulation film 110 may be placed at the same level as an upper surface of the conductive line 120. The conductive line 120 may function as a bit line of the semiconductor memory device according to some embodiments.

The conductive line 120 may include doped polysilicon, metal, conductive metal nitride, conductive metal silicide, conductive metal oxide, or combinations thereof. For example, the conductive line 120 may include, but is not limited to, doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminide (TiAl), titanium aluminum nitride (TiAlN), titanium silicide (TiSi), titanium silicon nitride (TiSiN), tantalum silicide (TaSi), tantalum silicon nitride (TaSiN), ruthenium titanium nitride (RuTiN), nickel silicide (NiSi), cobalt silicide (CoSi), iridium oxide ($IrO_x$), ruthenium oxide ($RuO_x$) or combinations thereof. Alternatively, the conductive line 120 may include a two-dimensional semiconductor material. The two-dimensional semiconductor material may include, for example, graphene, carbon nanotube, or a combination thereof. The conductive line 120 may include a single layer or multiple layers of the conductive materials described above.

The first interlayer insulation film 112 may be formed on the first substrate 100. The first interlayer insulation film 112 may include (e.g., define) a cell trench 112t that extends long in the second direction Y and crosses the conductive line 120. The plurality of cell trenches 112t each extend in the second direction Y and may be spaced apart from each other at equal intervals in the first direction X. Therefore, each of the first interlayer insulation films 112 may form pin-shaped insulating patterns that extend in the second direction Y and are spaced apart from each other by the cell trench 112t.

In some embodiments, the first interlayer insulation film 112 may be placed on the upper surface of the lower insulation film 110 to cover the conductive line 120. In some embodiments, a lower portion/surface of the cell trench 112t may be spaced apart from the upper surface of the conductive line 120.

In some embodiments, a width of the cell trench 112t may decrease toward the upper surface of the first substrate 100. Here, the width of the cell trench 112t means a width in the first direction X. This may be due to the characteristics of an etching process for forming the cell trench 112t.

The first interlayer insulation film 112 may include, for example, but is not limited to, at least one of silicon oxide, silicon oxynitride, silicon nitride, and a low dielectric constant (low-k) material having a lower dielectric constant than silicon oxide.

The gate electrodes 150A and 150B may be formed in the cell trench 112t. For example, the gate electrodes 150A and 150B may extend along the lower surface and the side surfaces of the cell trench 112t. Also, the gate electrodes 150A and 150B may each extend long in the second direction Y and cross the conductive line 120.

In some embodiments, the gate electrodes 150A and 150B may include a first gate electrode 150A and a second gate electrode 150B that are spaced apart from each other in the first direction X. The first gate electrode 150A and the second gate electrode 150B may face each other in the cell trench 112t. For example, the first gate electrode 150A may extend along the lower surface and a first side surface of the cell trench 112t, and the second gate electrode 150B may extend along the lower surface of the cell trench 112t and a second side surface thereof facing the first side surface. As an example, in a cross section intersecting the second direction Y (e.g., in FIG. 2), the gate electrodes 150A and 150B may each have an "L" shape. The first gate electrode 150A may function as a first word line of the semiconductor memory device according to some embodiments, and the second gate electrode 150B may function as a second word line of the semiconductor memory device according to some embodiments.

In some embodiments, a separation trench 150t may be formed in the first interlayer insulation film 112 and the gate electrodes 150A and 150B. The separation trench 150t may extend in the second direction Y to separate the first gate electrode 150A and the second gate electrode 150B. Further, the separation trench 150t may overlap (e.g., expose) a part of the conductive line 120. For example, a lower portion/surface of the separation trench 150t may overlap/expose a part of the upper surface of the conductive line 120.

The gate electrodes 150A and 150B may each include doped polysilicon, metal, conductive metal nitride, conductive metal silicide, conductive metal oxide, or a combination thereof. For example, the gate electrodes 150A and 150B may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$ or combinations thereof.

In some embodiments, the first gate electrode 150A and the second gate electrode 150B may each include a first conductive pattern 152 and a first barrier conductive film 154. The first conductive pattern 152 and the first barrier conductive film 154 may be sequentially stacked in the cell trench 112t. For example, the first conductive pattern 152 may conformally extend along the lower surface and the side surfaces of the cell trench 112t. The first barrier conductive film 154 may conformally extend along the profile of the first conductive pattern 152. The first barrier conductive film 154 may be interposed between the first conductive pattern 152 and a gate insulation layer 140 to be described below.

The first barrier conductive film 154 may reduce/prevent diffusion of the elements included in the first conductive pattern 152. As an example, the first conductive pattern 152 may include at least one of tungsten (W), aluminum (Al), and copper (Cu), and the first barrier conductive film 154 may include at least one of titanium (Ti), titanium nitride (TiN), tantalum (Ta), and tantalum nitride (TaN).

The gate insulation layer 140 may be stacked on the gate electrodes 150A and 150B. For example, the gate insulation layer 140 may conformally extend along the profile of the gate electrodes 150A and 150B. The gate insulation layer 140 may be interposed between the gate electrodes 150A and 150B and a channel layer 130 to be described below. In some embodiments, the gate insulation layer 140 may further extend along the upper surface of the first interlayer insulation film 112. In some embodiments, the gate insulation layer 140 may extend along the side surfaces of the separation trench 150t.

In some embodiments, the gate insulation layer 140 may have a gap/opening therein that overlaps (e.g., exposes) a part of the conductive line 120. For example, the gate insulation layer 140 may include a contact trench 140t inside the separation trench 150t. The lower portion/surface of the contact trench 140t may overlap/expose a part of the upper surface of the conductive line 120. Although FIG. 1 shows that the contact trench 140t has a rectangular shape, this is only an example. As another example, the contact trench 140t may have a circular or other polygonal shape. Also, although FIG. 1 shows that one contact trench 140t overlaps/exposes one conductive line 120, this is also only an example. As another example, one contact trench 140t may extend long in the second direction Y to overlap/expose the plurality of conductive lines 120.

The gate insulation layer 140 may include silicon oxide, silicon oxynitride, a high dielectric constant material having a higher dielectric constant than silicon oxide, or a combination thereof. The high dielectric constant material may include, but is not limited to, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide ($ZrO_2$), aluminum oxide ($Al_2O_3$), or a combination thereof.

In some embodiments, the gate insulation layer 140 may provide the semiconductor memory device according to some embodiments as a ferroelectric memory element (ferroelectric RAM, FeRAM).

As an example, the gate insulation layer 140 may include ferroelectrics such as barium titanate ($BaTiO_3$), lead zirconate titanate ($PbZrTiO_3$, PZT), strontium bismuth tantalate (STB; $SrBi_2Ta_2O_9$), bismuth iron oxide ($BiFeO_3$, BFO), and hafnium oxide ($HfO_2$).

The channel layer 130 may be stacked on (e.g., on an upper surface of) the gate insulation layer 140. The channel layer 130 may be inside (e.g., may fill at least a part of) the cell trench 112t. For example, the channel layer 130 may extend along the profiles of the gate electrodes 150A and 150B and the gate insulation layer 140. Therefore, each of the gate electrodes 150A and 150B and the gate insulation layer 140 may be interposed between the first interlayer insulation film 112 and the channel layer 130.

The channel layer 130 may be connected to the conductive line 120. In some embodiments, the channel layer 130 may be electrically connected to the upper surface of the conductive line 120 by extending through the separation trench 150t and the contact trench 140t. As shown in FIG. 1, the plurality of channel layers 130 are spaced apart from each other in the first direction X and the second direction Y, and may be arranged in a matrix form.

In the semiconductor memory device according to some embodiments, the channel layer 130 may include a first source/drain region and a second source/drain region that are arranged along a vertical direction (e.g., a third direction Z that intersects the first direction X and the second direction Y). For example, the lower part of the channel layer 130 may function as a first source/drain region, and the upper part of the channel layer 130 may function as a second source/drain region. A part of the channel layer 130 between the first source/drain region and the second source/drain region may function as a channel region.

The channel layer 130 may include a semiconductor material. As an example, the channel layer 130 may include an oxide semiconductor material. The oxide semiconductor material may reduce a leakage current of the semiconductor memory device. The oxide semiconductor material may include, for example, IGZO (indium gallium zinc oxide, $In_xGa_yZn_zO$), IGSO (indium gallium silicon oxide, $In_xGa_ySi_zO$), ITZO (indium tin zinc oxide, $In_xSn_yZn_zO$), IZO (indium zinc oxide, $In_xZn_yO$), ZnO (zinc oxide, $Zn_xO$), ZTO (zinc tin oxide, $Zn_xSn_yO$), ZnON (zinc oxynitride, $Zn_xO_yN$), ZZTO (zirconium zinc tin oxide, $Zr_xZn_ySn_zO$), SnO (tin oxide, $Sn_xO$), HIZO (hafnium indium zinc oxide, $Hf_xIn_yZn_zO$), GZTO (gallium zinc tin oxide, $Ga_xZn_ySn_zO$), AZTO (aluminum zinc tin oxide, $Al_xZn_ySn_zO$), YGZO (ytterbium gallium zinc oxide, $Yb_xGa_yZn_zO$), IGO (indium gallium oxide, $In_xGa_yO$) or a combination thereof.

As another example, the channel layer 130 may include silicon (Si) and germanium (Ge) as elemental semiconductor materials, or materials doped to them. Alternatively, the channel layer 130 may also include a group IV-IV compound semiconductor or a group III-V compound semiconductor. The group IV-IV compound semiconductor may be, for example, a binary compound or a ternary compound including at least two or more of carbon (C), silicon (Si), germanium (Ge), and tin (Sn), or a compound obtained by doping these elements with a group IV element.

As another example, the channel layer 130 may include a two-dimensional semiconductor material. The two-dimensional semiconductor material may include, for example, graphene, carbon nanotube, transition metal dichalcogenide (TMD), or a combination thereof. The TMD may include, for example, one metal element among Mo, W, Nb, vanadium (V), Ta, Ti, Zr, Hf, technetium (Tc), rhenium (Re), Cu, Ga, In, Sn, Ge and Pb, and one chalcogen element among sulfur (S), selenium (Se), and tellurium (Te).

The channel layer 130 may include a single layer or multiple layers of the semiconductor materials described above. Preferably, the channel layer 130 may include IGZO.

In some embodiments, the channel layer 130 may have a bandgap energy that is greater than a bandgap energy of silicon (Si). For example, the channel layer 130 may have a bandgap energy of about 1.5 electron volts (eV) to 5.6 eV. Preferably, the channel layer 130 may have a bandgap energy of about 2.0 eV to 4.0 eV. The channel layer 130 may be, but is not limited to, for example, polycrystalline or amorphous.

In some embodiments, the channel layer 130 may be a continuous layer that includes each of a penetration portion 132, a first extension portion 134A, and a second extension portion 134B. The penetration portion 132 may be interposed between the first gate electrode 150A and the second gate electrode 150B. The penetration portion 132 may penetrate the first interlayer insulation film 112 and be connected (e.g., electrically connected) to the conductive line 120. For example, the penetration portion 132 may be inside (e.g., may fill) the contact trench 140t. The first extension portion 134A may extend from the penetration portion 132 along the side surfaces of the first gate electrode 150A. The second extension portion 134B may extend from the penetration portion 132 along the side surfaces of the second gate electrode 150B.

In the semiconductor memory device according to some embodiments, the first extension portion 134A may function as a first channel region of a first transistor including the first gate electrode 150A, and the second extension portion 134B may function as a second channel region of a second transistor including the second gate electrode 150B. Accordingly, two transistor structures may be provided for each channel layer 130.

In some embodiments, the first extension portion 134A and the second extension portion 134B may face (e.g., may be opposite, in parallel with) each other inside the cell trench 112t. As an example, in a cross section intersecting the second direction Y (e.g., in FIG. 2), the first extension portion 134A and the second extension portion 134B may collectively have a "U" shape.

In some embodiments, a part of the first extension portion 134A and a part of the second extension portion 134B may be placed on the upper surface of the first interlayer insulation film 112. For example, the first extension portion 134A may further extend along the upper surface of the first gate electrode 150A, and the second extension portion 134B may further extend along the upper surface of the second gate electrode 150B.

The second interlayer insulation film 114 may be formed on the channel layer 130. For example, the second interlayer insulation film 114 may be formed on the gate insulation layer 140. The second interlayer insulation film 114 may separate a plurality of channel layers 130 that are spaced apart from each other and arranged in a matrix form. In some embodiments, the upper surface of the second interlayer insulation film 114 may be placed at the same level as the upper surface of the channel layer 130. That is, the second interlayer insulation film 114 may be on (e.g., may cover) the side surfaces of the channel layer 130. In some embodiments, the second interlayer insulation film 114 may be interposed between the first extension portion 134A and the second extension portion 134B. For example, the second interlayer insulation film 114 may be formed on the channel layer 130 to fill the cell trench 112t.

The second interlayer insulation film 114 may include, but is not limited to, for example, at least one of silicon oxide, silicon oxynitride, silicon nitride, and a low dielectric constant (low-k) material having a lower dielectric constant than silicon oxide.

Landing pads 160A and 160B may be formed on the first interlayer insulation film 112 and the second interlayer insulation film 114. Each of the landing pads 160A and 160B may be electrically connected to the channel layer 130. For example, a third interlayer insulation film 116 may be formed on the first interlayer insulation film 112 and the second interlayer insulation film 114. The landing pads 160A and 160B are each formed in the third interlayer insulation film 116 and may be electrically connected to the upper part of the channel layer 130.

In some embodiments, each of the landing pads 160A and 160B may be placed to overlap at least a part of the channel layer 130 in the vertical direction (e.g., the third direction Z). A plurality of landing pads 160A and 160B are spaced apart from each other in the first direction X and the second direction Y, and may be arranged in a matrix form. However, this is only an example, and the placement of the landing pads 160A and 160B is not limited, as long as the landing pads are electrically connected to the channel layer 130. As another example, the plurality of landing pads 160A and 160B may also be arranged in a honeycomb form.

In some embodiments, the landing pads 160A and 160B may include a first landing pad 160A and a second landing pad 160B that are spaced from each other in the first direction X. The first landing pad 160A may be in contact with one end (e.g., a first end) of the channel layer 130 adjacent to the first gate electrode 150A, and the second landing pad 160B may be in contact with the other end (e.g., a second end that is opposite the first end) of the channel layer 130 adjacent to the second gate electrode 150B. For example, the first landing pad 160A may be in contact with the first extension portion 134A, and the second landing pad 160B may be in contact with the second extension portion 134B.

In some embodiments, the first landing pad 160A may be in contact with the upper surface of the first extension portion 134A that extends along the upper surface of the first gate electrode 150A, and the second landing pad 160B may be in contact with the upper surface of the second extension portion 134B that extends along the upper surface of the second gate electrode 150B.

Although the drawings show that the first landing pad 160A overlaps the first gate electrode 150A in the third direction Z, and the second landing pad 160B overlaps the second gate electrodes 150B in the third direction Z, this is only an example. As long as each of the first landing pad 160A and the second landing pad 160B is electrically connected to the channel layer 130, the placement of the first landing pad 160A and the second landing pad 160B may, of course, be various.

The landing pads 160A and 160B may each include doped polysilicon, metal, conductive metal nitride, conductive metal silicide, conductive metal oxide, or a combination thereof. For example, the landing pads 160A and 160B may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$ or combinations thereof.

The capacitor structures 170A and 170B may be formed on the landing pads 160A and 160B. The capacitor structures 170A and 170B may be arranged to correspond to the landing pads 160A and 160B. The landing pads 160A and 160B may electrically connect the channel layer 130 and the capacitor structures 170A and 170B. The capacitor structures 170A and 170B may each include lower electrodes 173A and 173B, a capacitor dielectric layer 175, and an upper electrode 178.

In some embodiments, the capacitor structures 170A and 170B may provide the semiconductor memory device according to some embodiments as a dynamic memory element (dynamic RAM, DRAM). For example, the capacitor structures 170A and 170B may store the data (charge) inside the capacitor dielectric layer 175, by utilizing a potential difference occurring between the lower electrodes 173A and 173B and the upper electrode 178.

The lower electrodes 173A and 173B may be electrically connected to the landing pads 160A and 160B. Each of the lower electrodes 173A and 173B may have, but are not limited to, a pillar shape extending in the vertical direction (for example, the third direction Z). In some embodiments, the lower electrodes 173A and 173B may be placed to overlap the landing pads 160A and 160B in the vertical direction (e.g., the third direction Z). For example, a plurality of lower electrodes 173A and 173B are spaced apart from each other in the first direction X and the second direction Y, and may be arranged in a matrix form.

In some embodiments, the lower electrodes 173A and 173B may be spaced apart from each other in the first direction X. The lower electrode 173A may be in contact with the upper surface of the first landing pad 160A, and the lower electrode 173B may be in contact with the upper surface of the second landing pad 160B. Therefore, the capacitor structures 170A and 170B may include a first capacitor structure 170A and a second capacitor structure 170B arranged along the first direction X.

The capacitor dielectric layer 175 may be interposed between the lower electrodes 173A and 173B and the upper electrodes 178. As an example, the capacitor dielectric layer 175 may conformally extend along outer peripheral surfaces of the lower electrodes 173A and 173B and the upper surface of the third interlayer insulation film 116. The upper electrode 178 may be formed on the upper surface of the capacitor dielectric layer 175.

In some embodiments, the upper electrode 178 may be a plate-shaped structure that extends along a plane that intersects the third direction Z. As an example, a fourth interlayer insulation film 118 that fills the space between the lower electrodes 173A and 173B may be formed on the capacitor dielectric layer 175. The upper electrode 178 may extend along the upper surface of the fourth interlayer insulation film 118. However, this is only an example, and the fourth interlayer insulation film 118 may be omitted. As another example, the upper electrode 178 may be formed on the capacitor dielectric layer 175 to fill the space between the lower electrodes 173A and 173B.

The lower electrodes 173A and 173B and the upper electrode 178 may each include doped polysilicon, metal, conductive metal nitride, conductive metal silicide, conductive metal oxide, or a combination thereof. For example, the lower electrodes 173A and 173B and the upper electrode 178 may include, but are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$ or combinations thereof.

The capacitor dielectric layer 175 may include silicon oxide, silicon oxynitride, a high dielectric constant material having a higher dielectric constant than silicon oxide, or a combination thereof. The high dielectric constant material may include, but is not limited to, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide ($ZrO_2$), aluminum oxide ($Al_2O_3$) or a combination thereof.

In some embodiments, each of the lower electrode 173A and the lower electrode 173B may include a second conductive pattern 171 and a second barrier conductive film 172. The second conductive pattern 171 and the second barrier conductive film 172 may be sequentially stacked on the landing pads 160A and 160B. For example, the second conductive pattern 171 may have a pillar shape extending in the vertical direction (e.g., in the third direction Z) on the landing pads 160A and 160B. The second barrier conductive film 172 may conformally extend along the side surfaces and the upper surface of the second conductive pattern 171. The second barrier conductive film 172 may be interposed between the second conductive pattern 171 and the capacitor dielectric layer 175.

The second barrier conductive film 172 may reduce/prevent diffusion of the elements included in the second conductive pattern 171. As an example, the second conductive pattern 171 may include at least one of tungsten (W), aluminum (Al), and copper (Cu), and the second barrier conductive film 172 may include at least one of titanium (Ti), titanium nitride (TiN), tantalum (Ta), and tantalum nitride (TaN).

In some embodiments, the upper electrode 178 may include a third barrier conductive film 177 and a third conductive pattern 176. The third barrier conductive film 177 and the third conductive pattern 176 may be sequentially stacked on the capacitor dielectric layer 175. For example, the third barrier conductive film 177 may conformally extend along the capacitor dielectric layer 175. In some embodiments, the third barrier conductive film 177 may be interposed between the capacitor dielectric layer 175 and the fourth interlayer insulation film 118. The third conductive pattern 176 may be a plate-like structure extending along a plane intersecting the third direction Z. The third conductive pattern 176 may extend along the uppermost surface of the third barrier conductive film 177. In some embodiments, the third conductive pattern 176 may extend along the upper surface of the fourth interlayer insulation film 118. For example, the upper surface of the fourth interlayer insulation film 118 may be placed at the same level as the uppermost surface of the third barrier conductive film 177.

The third barrier conductive film 177 may reduce/prevent diffusion of the elements included in the third conductive pattern 176. As an example, the third conductive pattern 176 may include at least one of tungsten (W), aluminum (Al), and copper (Cu), and the third barrier conductive film 177 may include at least one of titanium (Ti), titanium nitride (TiN), tantalum (Ta), and tantalum nitride (TaN).

In order to improve the degree of integration of the semiconductor memory device, semiconductor memory devices including a vertical channel transistor with channels extending in the vertical direction are proposed. In order to implement such semiconductor memory devices, a gate insulation layer and a gate electrode may be stacked on the side surfaces of the channel layer extending in the vertical direction. However, in such a case, the channel layer may be damaged or its characteristics may be deteriorated in the process of forming the gate insulation layer and the gate electrode (for example, a thermal process or the like), which may cause decreases in performance and reliability of the semiconductor memory device.

However, as described above, in the semiconductor memory device according to some embodiments, the channel layer 130 may be formed by being stacked on the gate electrodes 150A and 150B and the gate insulation layer 140. Therefore, a semiconductor device with improved performance and reliability may be provided.

In addition, the semiconductor memory device according to some embodiments may have two transistor structures for each channel layer 130. For example, as described above, the gate electrodes 150A and 150B may include a first gate electrode 150A and a second gate electrode 150B that are spaced apart from each other in the cell trench 112t. Accordingly, it is possible to provide a semiconductor memory device having a further improved degree of integration.

Further, in the semiconductor memory device according to some embodiments, a part of the channel layer 130 may be placed on the upper surface of the first interlayer insulation film 112. For example, as described above, the first extension portion 134A may further extend along the upper surface of the first gate electrode 150A, and the second extension portion 134B may further extend along the upper surface of be the second gate electrode 150B. In such a case, the distance between the landing pads 160A and 160B and the gate electrodes 150A and 150B may be adjusted by the thickness of the channel layer 130. Therefore, it is possible to provide the semiconductor memory device according to some embodiments in which the distance between the landing pads 160A and 160B and the gate electrodes 150A and 150B is easily adjusted.

FIGS. 4 to 8, 9A, and 9B are various cross-sectional views for explaining the semiconductor memory device according to some embodiments. For convenience of explanation, repeated parts of contents explained above using FIGS. 1 to 3 may be briefly explained or omitted.

Figure 4:
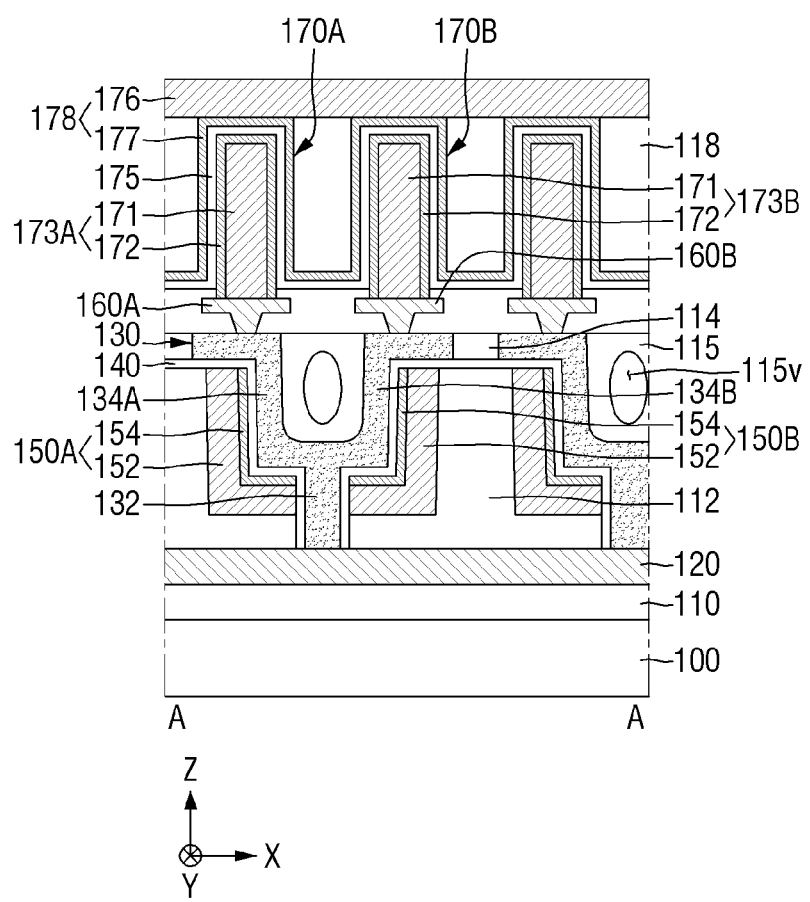
FIGS. 4 to 8, 9A, and 9B are various cross-sectional views for explaining the semiconductor memory device according to some embodiments.

Referring to FIG. 4, the semiconductor memory device according to some embodiments further includes a filling insulation film 115.

The filling insulation film 115 may be formed on the channel layer 130. The filling insulation film 115 may be interposed between the first extension portion 134A and the second extension portion 134B. For example, the filling insulation film 115 may be formed on the channel layer 130 to fill the cell trench 112t. In some embodiments, the upper surface of the filling insulation film 115 may be placed at the same level as the upper surface of the channel layer 130.

The filling insulation film 115 may include a material different from a second interlayer insulation film 114. The filling insulation film 115 may include, but is not limited to, for example, at least one of silicon oxide, silicon oxynitride, silicon nitride, and a low dielectric constant (low-k) material having a smaller dielectric constant than silicon oxide.

In some embodiments, a dielectric constant of the filling insulation film 115 may be smaller than that of the second interlayer insulation film 114. As an example, the second interlayer insulation film 114 may include silicon oxide, and the filling insulation film 115 may include a low dielectric constant (low-k) material. Examples of the low dielectric constant materials may include, but are not limited to, at least one of FOX (Flowable Oxide), TOSZ (Tonen SilaZane), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and a combination thereof.

In some embodiments, the filling insulation film 115 may include a void 115v. The void 115v may be a gap region in which the filling insulation film 115 is not filled. For example, the void 115v may be an air gap. Since the void 115v has a low dielectric constant, the parasitic capacitance of the semiconductor memory device according to some embodiments can be effectively reduced. Although the void 115v is shown as being formed in the filling insulation film 115, this is only an example. As another example, in order to reduce the parasitic capacitance of the semiconductor memory device according to some embodiments, the void 115v may, of course, be formed in the second interlayer insulation film 114 of FIG. 2.

Figure 5:
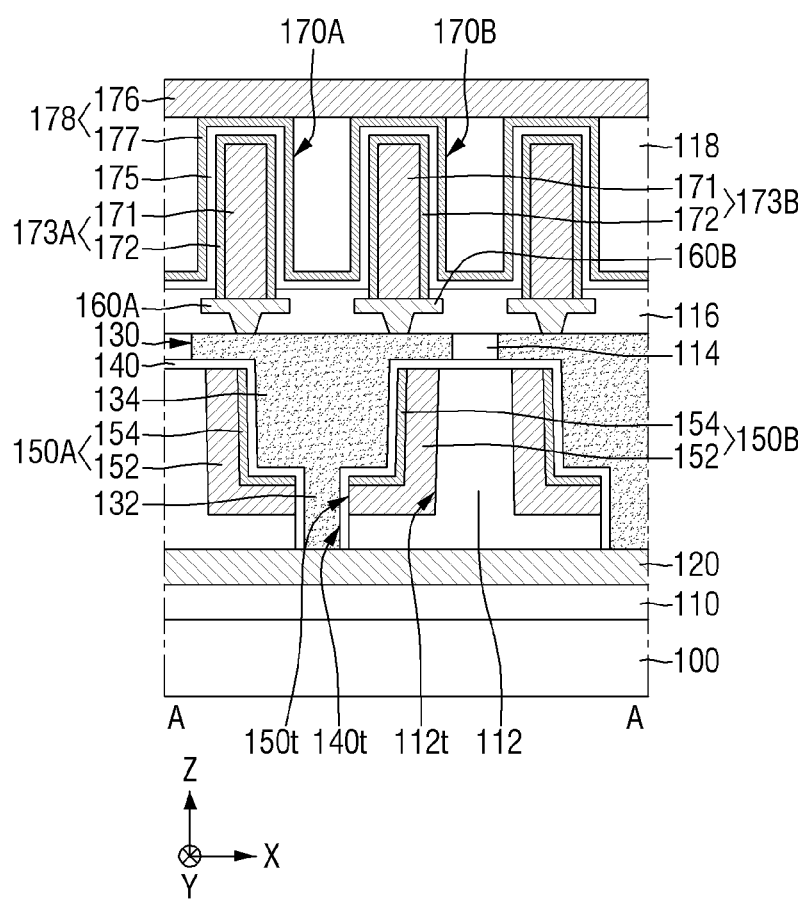

Referring to FIG. 5, in the semiconductor memory device according to some embodiments, the channel layer 130 fills the cell trench 112t.

For example, the channel layer 130 may include a filling part 134. The filling part 134 may extend from the penetration portion 132 to fill the cell trench 112t. In the semiconductor memory device according to some embodiments, a part of the filling part 134 adjacent to the first gate electrode 150A may function as a channel region of a transistor including the first gate electrode 150A. The other part of the filling part 134 adjacent to the second gate electrode 150B may function as a channel region of a transistor including the second gate electrode 150B.

In some embodiments, a part of the filling part 134 may be placed on the upper surface of the first interlayer insulation film 112. For example, a part of the filling part 134 may extend along the upper surface of the first gate electrode 150A and the upper surface of the second gate electrode 150B.

Figure 6:
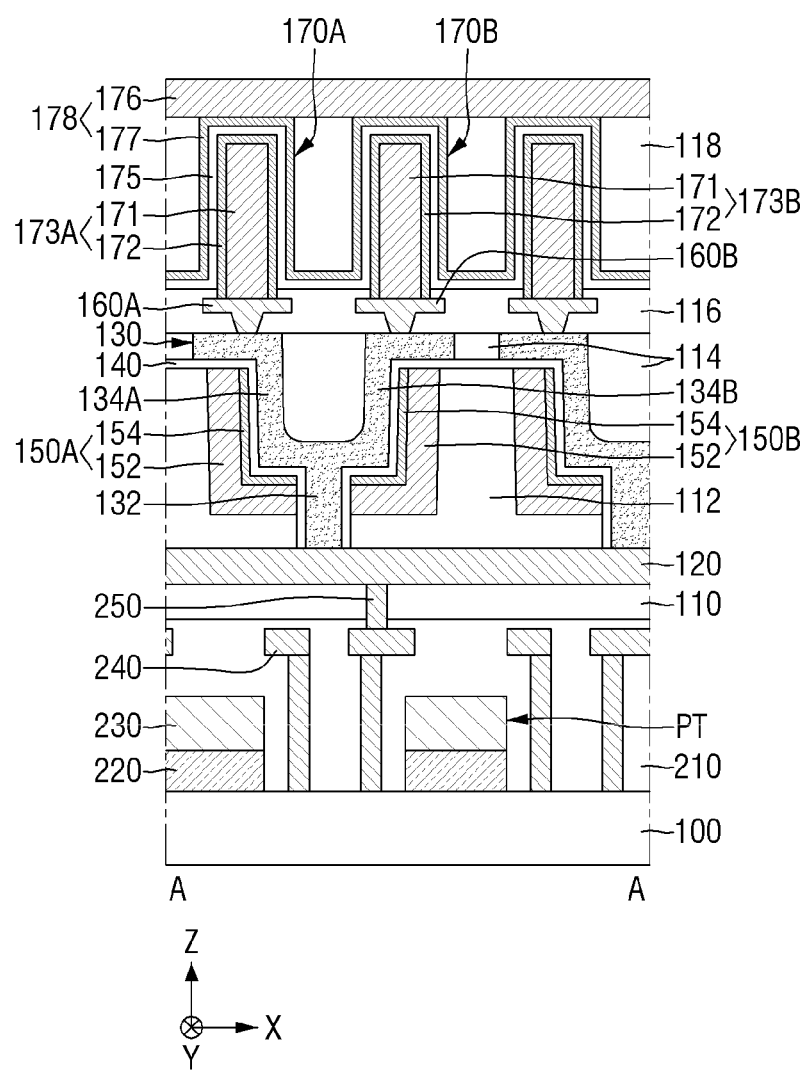

Referring to FIG. 6, the semiconductor memory device according to some embodiments further includes a peripheral circuit element PT and an inter-wiring insulation film 210.

The peripheral circuit element PT and the inter-wiring insulation film 210 may be formed on the first substrate 100. The peripheral circuit element PT may control the functions of the semiconductor memory elements formed on the first substrate 100, including control elements and dummy elements. The inter-wiring insulation film 210 may cover the peripheral circuit element PT.

In some embodiments, the peripheral circuit element PT may include a fourth conductive pattern 220 and a fifth conductive pattern 230 that are sequentially formed on the upper surface of the first substrate 100. The fourth conductive pattern 220 and the fifth conductive pattern 230 may form various circuit elements for controlling the functions of the semiconductor memory elements. The peripheral circuit element PT may include, for example, not only various active elements such as a transistor, but also various passive elements such as a capacitor, a resistor, and an inductor.

In some embodiments, the peripheral circuit element PT and the inter-wiring insulation film 210 may be placed below the first interlayer insulation film 112. For example, the lower insulation film 110 may be stacked on the upper surface of the inter-wiring insulation film 210. The first interlayer insulation film 112 may be stacked on the upper surface of the lower insulation film 110. That is, the semiconductor memory device according to some embodiments may have a COP (cell on peri) structure.

In some embodiments, the peripheral circuit element PT may be electrically connected to the conductive line 120. For example, a wiring pattern 240 electrically connected to the peripheral circuit element PT may be formed in the inter-wiring insulation film 210. In addition, a connecting via 250 that penetrates the lower insulation film 110 and electrically connects the conductive line 120 and the wiring pattern 240 may be formed. Therefore, the conductive line 120 may be electrically controlled by the peripheral circuit element PT.

Figure 7:
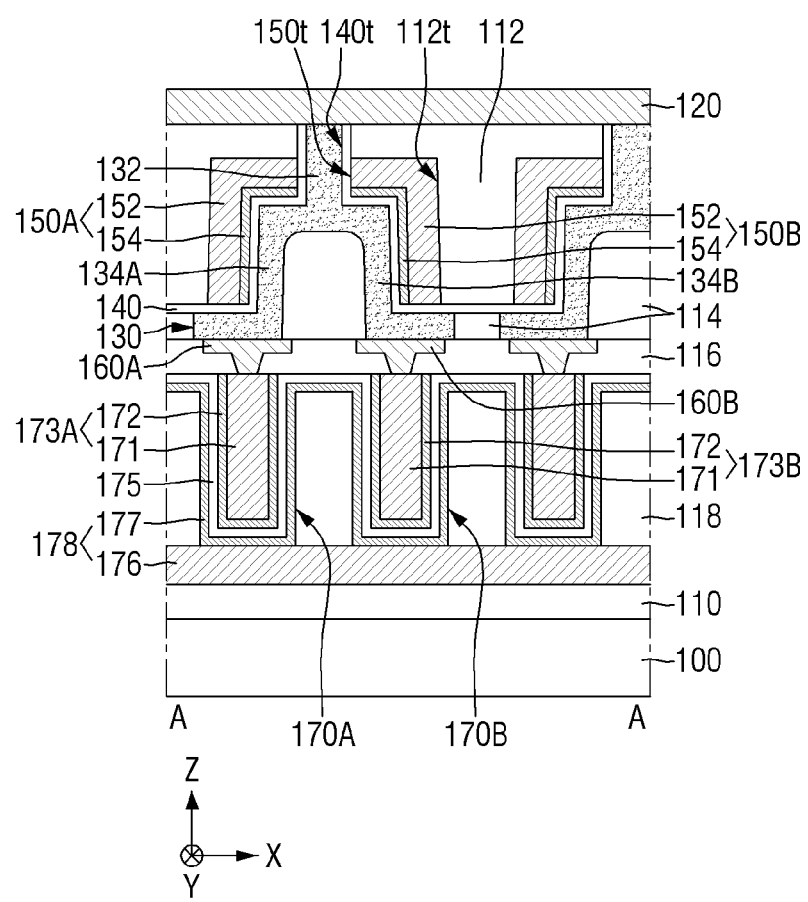
Figure 8:
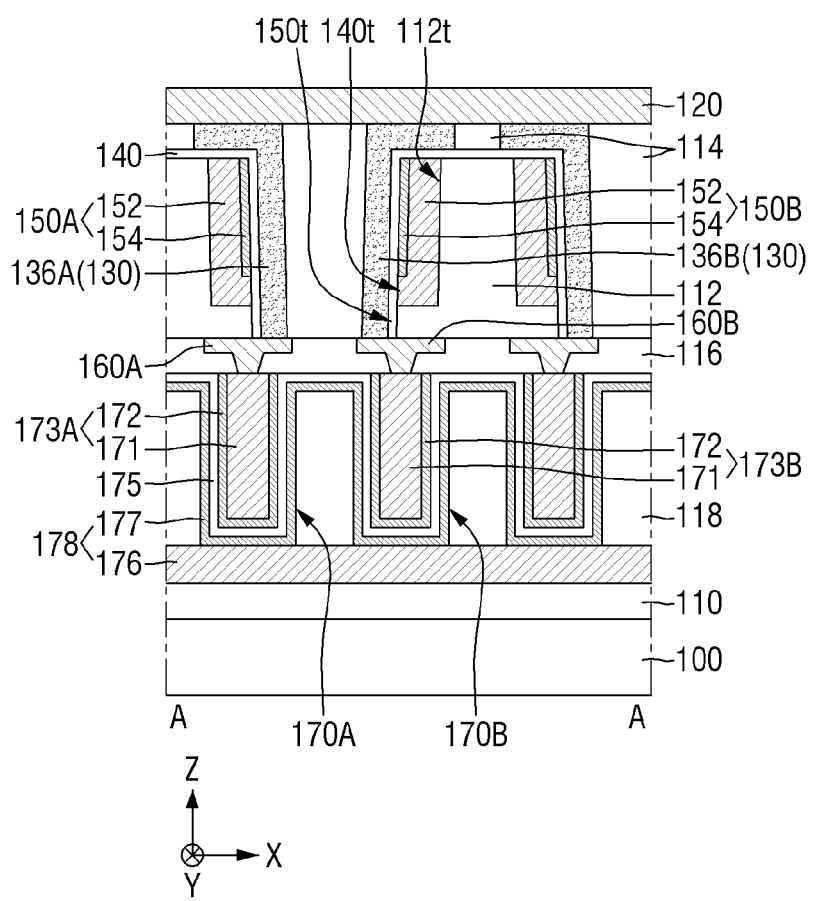

Referring to FIGS. 7 and 8, in the semiconductor memory device according to some embodiments, the capacitor structures 170A and 170B are interposed between the first substrate 100 and the channel layer 130.

The capacitor structures 170A and 170B may be formed on the first substrate 100. For example, the third conductive pattern 176 may be formed on the lower insulation film 110. Further, a fourth interlayer insulation film 118 may be formed on the third conductive pattern 176 and the lower insulation film 110. The third barrier conductive film 177, the capacitor dielectric layer 175, and the lower electrodes 173A and 173B may be sequentially stacked on the fourth interlayer insulation film 118.

The third interlayer insulation film 116 may be formed on the fourth interlayer insulation film 118. The landing pads 160A and 160B are formed in the third interlayer insulation film 116, and may be electrically connected to the upper surfaces of the lower electrodes 173A and 173B.

The first interlayer insulation film 112 and the second interlayer insulation film 114 may be formed on the third interlayer insulation film 116. The channel layer 130 may be electrically connected to the landing pads 160A and 160B. The conductive line 120 may be formed on the first interlayer insulation film 112. The conductive line 120 may be electrically connected to the channel layer 130.

Referring to FIG. 7, in some embodiments, the width of the cell trench 112t may increase toward the upper surface of the first substrate 100. Here, the width of the cell trench 112t means the width in the first direction X.

The conductive line 120, the first interlayer insulation film 112, the gate electrodes 150A and 150B, the gate insulation layer 140, the channel layer 130 and the second interlayer insulation film 114 of FIG. 7 may be vertically inverted relative to the conductive line 120, the first interlayer insulation film 112, the gate electrodes 150A and 150B, the gate insulation layer 140, the channel layer 130, and the second interlayer insulation film 114 shown in FIG. 2. For example, the lower surface of the first extension portion 134A extending along the lower surface of the first gate electrode 150A may be electrically connected to the upper surface of the first landing pad 160A, and the lower surface of the second extension portion 134B extending along the lower surface of the second gate electrode 150B may be electrically connected to the upper surface of the second landing pad 160B.

Referring to FIG. 8, in some embodiments, the width of the cell trench 112t may decrease toward the upper surface of the first substrate 100. Here, the width of the cell trench 112t means the width in the first direction X.

In FIG. 8, the separation trench 150t and the contact trench 140t may overlap (e.g., expose) the landing pads 160A and 160B. For example, the lower portions/surfaces of the separation trench 150t and the contact trench 140t may overlap/expose the upper surfaces of the landing pads 160A and 160B. The channel layer 130 may extend through the separation trench 150t and the contact trench 140t to electrically connect to the upper surfaces of the landing pads 160A and 160B. For example, the first extension portion 134A extends along the side surfaces of the separation trench 150t and the side surfaces of the contact trench 140t and may be electrically connected to the first landing pad 160A. The second extension portion 134B extends along the side surfaces of the separation trench 150t and the side surfaces of the contact trench 140t and may be electrically connected to the second landing pad 160B.

In some embodiments, the first extension portion 134A and the second extension portion 134B may be spaced apart from each other in the first direction X. For example, the second interlayer insulation film 114 may be interposed between the first extension portion 134A and the second extension portion 134B to separate the first extension portion 134A and the second extension portion 134B.

In some embodiments, the conductive line 120 may be electrically connected to the first extension portion 134A and the second extension portion 134B. For example, the conductive line 120 may be in contact with the upper surface of the first extension portion 134A extending along the upper surface of the first gate electrode 150A and the upper surface of the second extension portion 134B extending along the upper surface of the second gate electrode 150B.

Figure 9A:
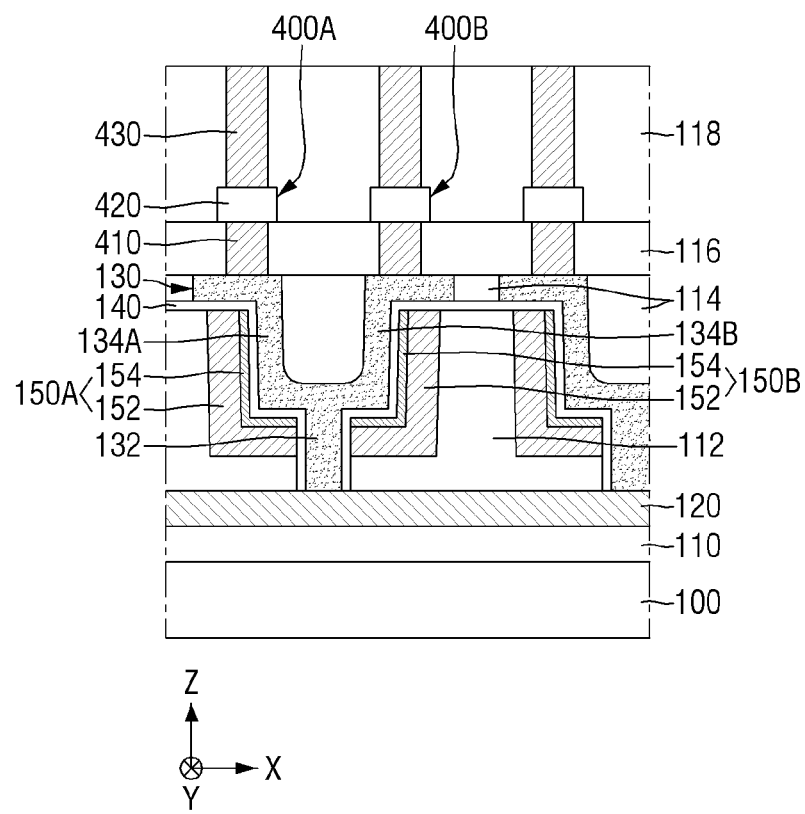

Referring to FIG. 9A, the semiconductor memory device according to some embodiments includes memory structures 400A and 400B.

Each of the memory structures 400A and 400B may be electrically connected to the channel layers 130. In some embodiments, the memory structures 400A and 400B may include a first memory structure 400A and a second memory structure 400B arranged along the first direction X. Each of the first memory structure 400A and the second memory structure 400B may be electrically connected to the channel layer 130. For example, the first memory structure 400A may be in contact with the upper surface of the first extension portion 134A, and the second memory structure 400B may be in contact with the upper surface of the second extension portion 134B.

Each of the memory structures 400A and 400B may include a first electrode 410, a variable resistor pattern 420 and a second electrode 430. The first electrode 410, the variable resistor pattern 420 and the second electrode 430 may be sequentially formed on the channel layer 130. The first electrode 410 may electrically connect the channel layer 130 and the variable resistor pattern 420. The second electrode 430 may be electrically connected to the variable resistor pattern 420.

In some embodiments, the memory structures 400A and 400B may provide the semiconductor memory device according to some embodiments as a phase changeable memory element (phase changeable RAM, PRAM).

For example, the variable resistor pattern 420 may store data by a phase change due to Joule heat. The variable resistor pattern 420 may be made up of, for example, a phase change material including at least one of chalcogenide and super lattice. The chalcogenide may include, for example, at least one of Ge—Sb—Te, Ge—Te—As, Sn—Te—Sn, Ge—Te, Sb—Te, Se—Te—Sn, Ge—Te—Se, Sb—Se—Bi, Ge—Bi—Te, Ge—Te—Ti, In—Se, Ga—Te—Se, In—Sb—Te, and Bi—Sb—Te. As an example, the super lattice may include an alloy in which Ge—Te and Sb—Te are alternately stacked.

In some embodiments, the memory structures 400A and 400B may provide the semiconductor memory device according to some embodiments as a resistive memory element (resistive RAM, RRAM).

For example, the variable resistor pattern 420 may store data by resistance changes due to perovskite-based materials or transition metal oxides. The perovskite-based substance may include, for example, at least one of STO($SrTiO_3$), BTO($BaTiO_3$) and PCMO ($Pr1-XCaXMnO_3$). The transition metal oxides may include, for example, at least one of titanium oxide ($TiO_x$), zirconium oxide ($ZrO_x$), aluminum oxide (AlO$_x$), hafnium oxide (HfO$_x$), tantalum oxide (TaO$_x$), niobium oxide (NbO$_x$), cobalt oxide (CoO$_x$), tungsten oxide (WO$_x$), lathanum oxide (LaO$_x$), and zinc oxide (ZnO$_x$).

In some embodiments, the memory structures 400A and 400B may provide the semiconductor memory device according to some embodiments as a magnetic memory element (magnetic RAM, MRAM).

For example, the variable resistor pattern 420 may store data by a resistance change due to a magnetic field or spin transfer torque (STT). As an example, the variable resistor pattern 420 may include ferromagnetics including at least one of iron (Fe), nickel (Ni), cobalt (Co), dysprosium (Dy) and gadolinium (Gd).

In some embodiments, the memory structures 400A and 400B may provide the semiconductor memory device according to some embodiments as a ferroelectric memory element (ferroelectric RAM, FeRAM).

As an example, the variable resistor pattern 420 may include ferroelectrics such as barium titanate (BaTiO$_3$), lead zirconate titanate (PbZrTiO$_3$, PZT), strontium bismuth tantalate (STB; SrBi$_2$Ta$_2$O$_9$), bismuth iron oxide (BiFeO$_3$, BFO), and hafnium oxide (HfO$_2$).

Figure 9B:
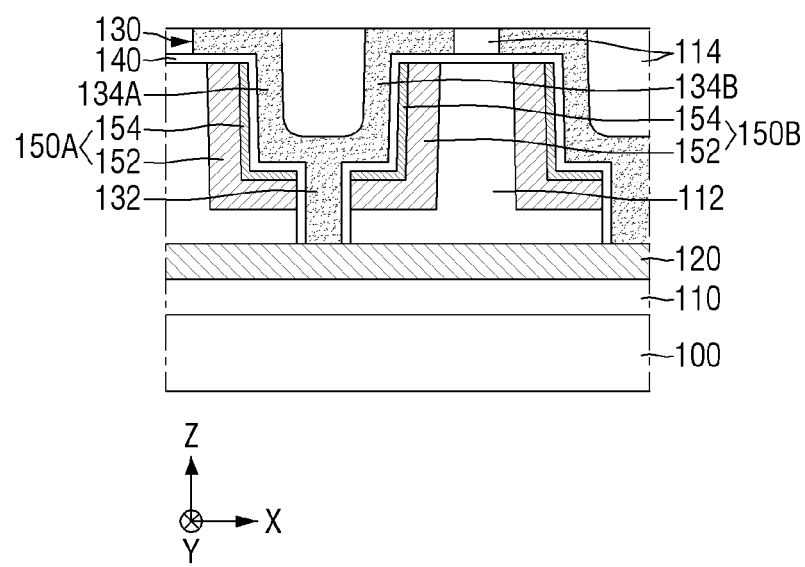

Referring to FIG. 9B, the semiconductor memory device according to some embodiments does not include a capacitor structure (e.g., the capacitor structures 170A and 170B of FIG. 2).

The semiconductor memory device according to some embodiments may be provided as a single (1) transistor DRAM (1T-DRAM). For example, the semiconductor memory device according to some embodiments may store data (charge), by utilizing a floating body effect of the first substrate 100 of a SOI (Semiconductor On Insulator) type.

In some embodiments, the gate insulation layer 140 may provide the semiconductor memory device according to some embodiments as a ferroelectric memory element (ferroelectric RAM, FeRAM). As an example, the gate insulation layer 140 may include ferroelectrics such as barium titanate (BaTiO$_3$), lead zirconate titanate (PbZrTiO$_3$, PZT), strontium bismuth tantalate (STB; SrBi$_2$Ta$_2$O$_9$), bismuth iron oxide (BiFeO$_3$, BFO), and hafnium oxide (HfO$_2$)

Figure 10:
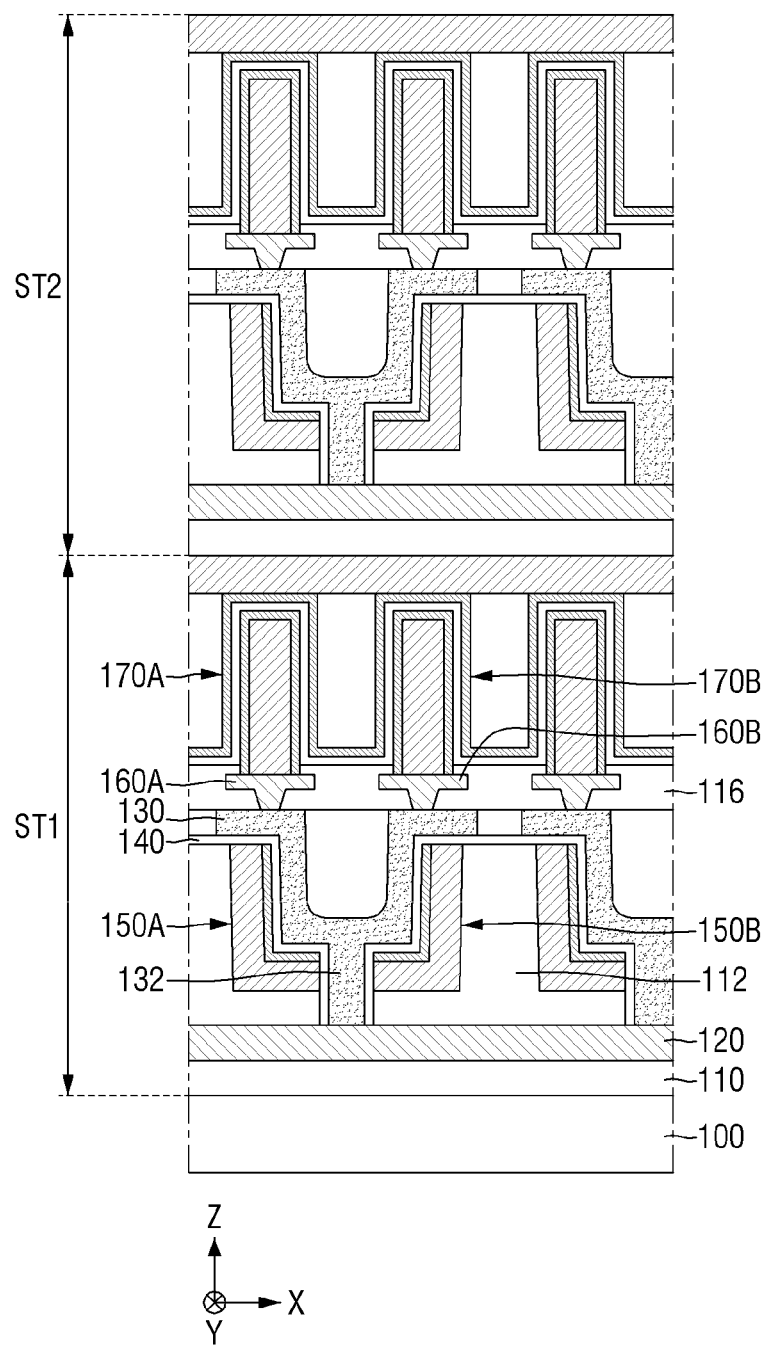
FIGS. 10 to 12 are various cross-sectional views for explaining a stacked structure of the semiconductor memory device according to some embodiments.
Figure 11:
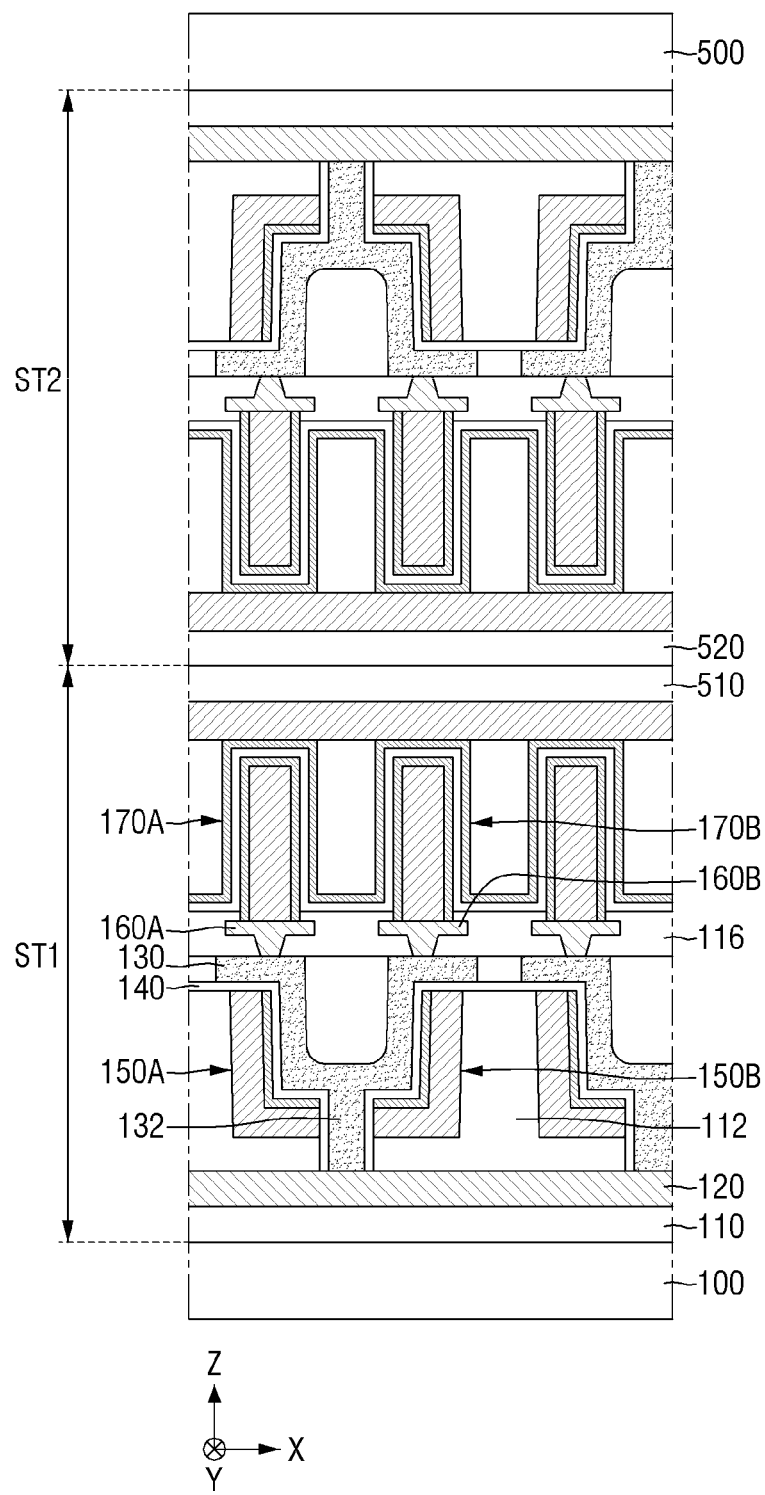
Figure 12:
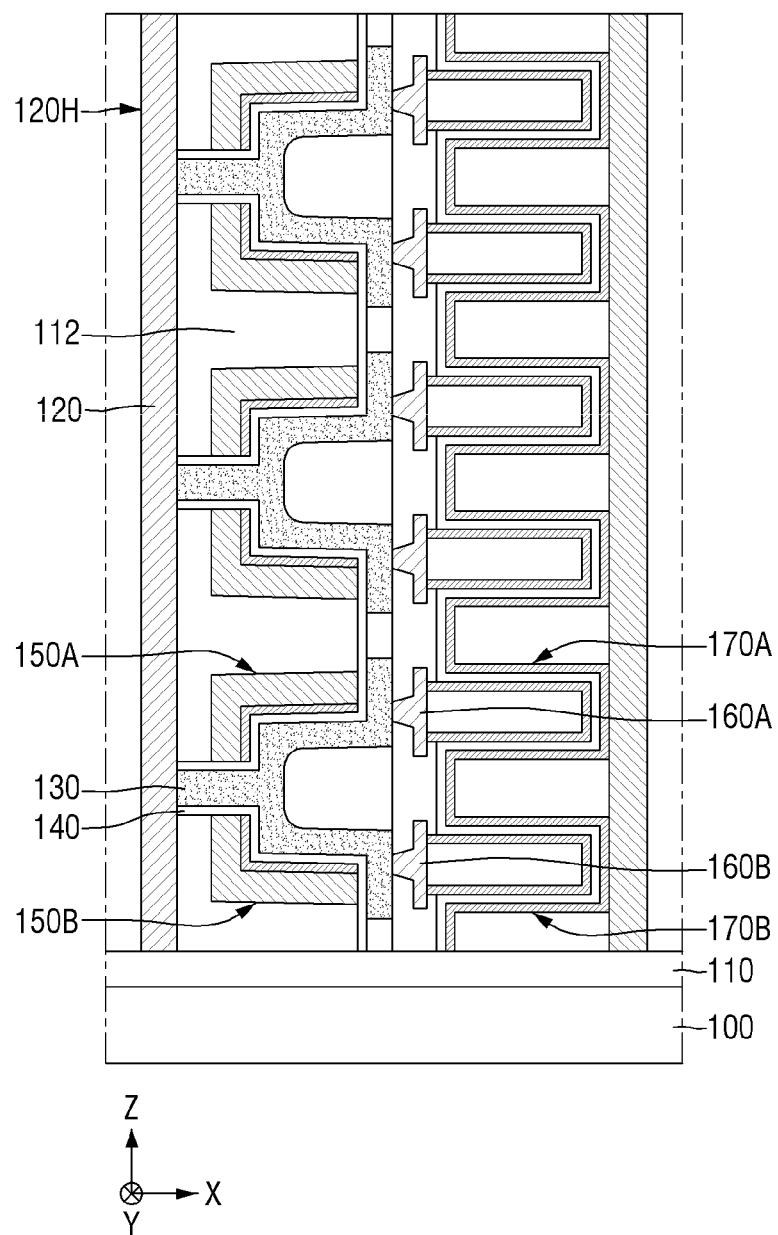

FIGS. 10 to 12 are various cross-sectional views for explaining a stacked structure of the semiconductor memory device according to some embodiments. For convenience of explanation, repeated parts of contents explained above using FIGS. 1 to 8, 9A, and 9B may be briefly explained or omitted.

Referring to FIGS. 10 and 11, the semiconductor memory device according to some embodiments includes a first stack ST1 and a second stack ST2.

The first stack ST1 and the second stack ST2 may be sequentially stacked on the first substrate 100. That is, the first stack ST1 and the second stack ST2 may be arranged along the vertical direction (for example, the third direction Z). Each of the first stack ST1 and the second stack ST2 may include the conductive line 120, the first interlayer insulation film 112, the gate electrodes 150A and 150B, the gate insulation layer 140, the channel layer 130, the second interlayer insulation film 114, the landing pads 160A and 160B, and the capacitor structures 170A and 170B.

Referring to FIG. 10, in some embodiments, the conductive line 120 of the second stack ST2 may be stacked on the capacitor structures 170A and 170B of the first stack ST1. For example, the conductive line 120 of the second stack ST2 may be interposed between the capacitor structures 170A and 170B of the first stack ST1 and the channel layer 130 of the second stack ST2.

Although FIG. 10 shows that only two stacks are stacked on the first substrate 100, this is only an example. Of course, three or more stacks may be stacked on the first substrate 100.

Referring to FIG. 11, in some embodiments, the capacitor structures 170A and 170B of the second stack ST2 may be stacked on the capacitor structures 170A and 170B of the first stack ST1. For example, the capacitor structures 170A and 170B of the second stack ST2 may be interposed between the capacitor structures 170A and 170B of the first stack ST1 and the channel layer 130 of the second stack ST2.

In some embodiments, the first stack ST1 and the second stack ST2 may be stacked by a W-to-W (wafer to wafer) bonding way. For example, the conductive line 120, the first interlayer insulation film 112, the gate electrodes 150A and 150B, the gate insulation layer 140, the channel layer 130, the second interlayer insulation film 114, the landing pads 160A and 160B, and the capacitor structures 170A and 170B of the second stack ST2 may be formed on the second substrate 500. Also, each of the first stack ST1 and the second stack ST2 may include sticking (e.g., adhesive) films 510 and 520 formed on the capacitor structures 170A and 170B. As the sticking films 510 and 520 are stuck to each other, the second stack ST2 may be stacked on the first stack ST1.

Referring to FIG. 12, in the semiconductor memory device according to some embodiments, the conductive line 120, the channel layer 130 and the capacitor structures 170A and 170B are arranged along a direction parallel to the upper surface of the first substrate 100.

For example, the conductive line 120, the channel layer 130 and the capacitor structures 170A and 170B may be sequentially arranged on the lower insulation film 110 along the first direction X.

In some embodiments, the plurality of channel layers 130 may be arranged along the vertical direction (e.g., the third direction Z). Although FIG. 12 shows that only three channel layers 130 are arranged on the first substrate 100, this is only an example. Of course, four or more channel layers 130 may be arranged on the first substrate 100.

In some embodiments, the conductive line 120 may extend long along the vertical direction (e.g., the third direction Z). For example, a through hole 120H extending in the third direction Z and penetrating the first interlayer insulation film 112 may be formed. The conductive line 120 may fill the through hole 120H. The conductive line 120 may be electrically connected to a plurality of channel layers 130 arranged along the vertical direction (e.g., the third direction Z).

Hereinafter, a method for fabricating a semiconductor memory device according to an example embodiment will be described referring to FIGS. 1 to 32.

FIGS. 13 to 27 are intermediate stage diagrams for explaining the method for fabricating the semiconductor memory device according to some embodiments. For convenience of explanation, repeated parts of contents explained above using FIGS. 1 to 12 may be briefly explained or omitted.

Figure 13:
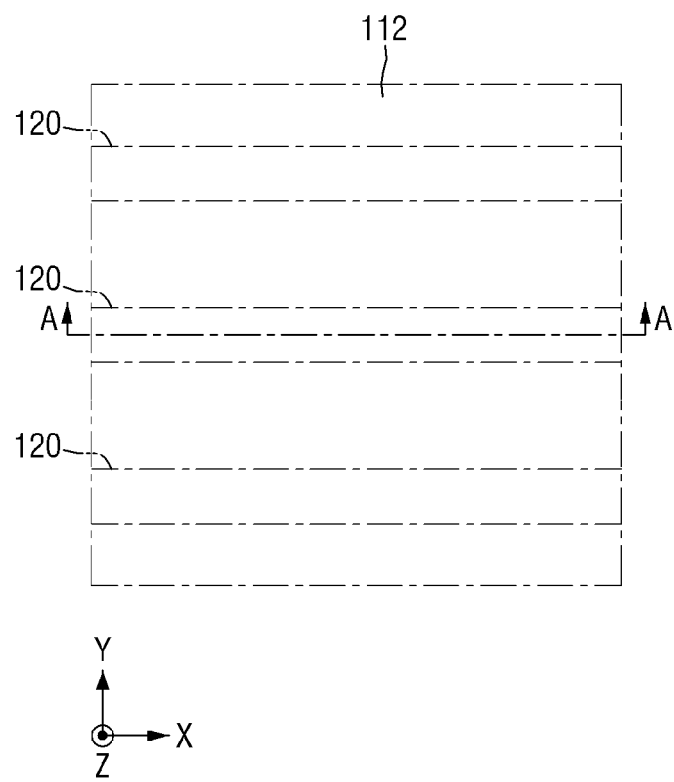
FIGS. 13 to 27 are intermediate stage diagrams for explaining a method for fabricating the semiconductor memory device according to some embodiments.
Figure 14:
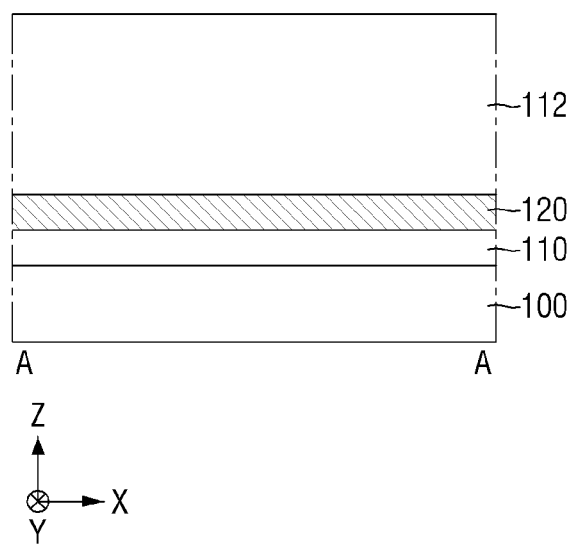

Referring to FIGS. 13 and 14, the conductive line 120 and the first interlayer insulation film 112 are formed on the first substrate 100.

For example, the lower insulation film 110 may be formed on the first substrate 100, and the conductive line 120 may be formed on the lower insulation film 110. The conductive line 120 may extend long in the first direction X. The plurality of conductive lines 120 each extend in the first direction X, and may be spaced at equal intervals in the second direction Y intersecting the first direction X.

The first interlayer insulation film 112 may be formed on the lower insulation film 110. The first interlayer insulation film 112 may cover the upper surface of the lower insulation film 110 and the upper surface of the conductive line 120.

Figure 15:
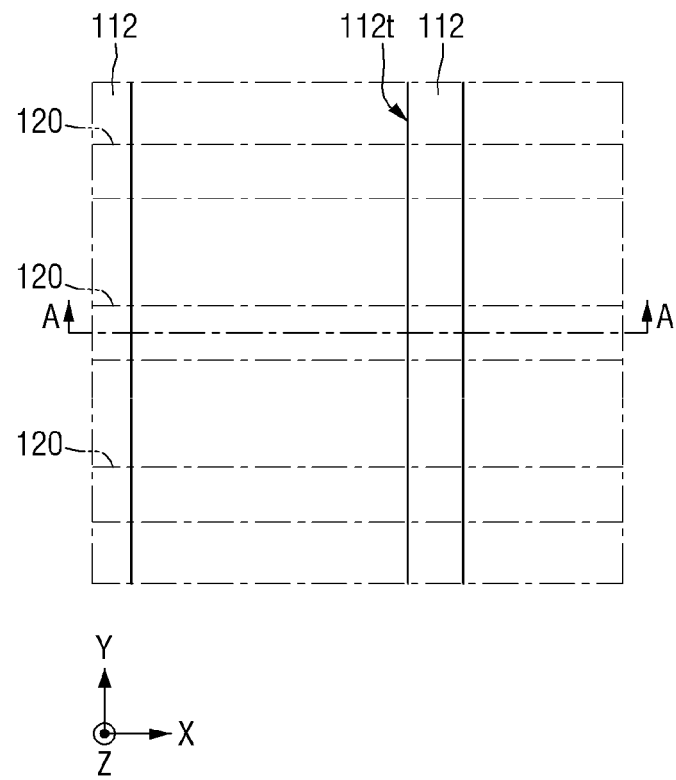
Figure 16:
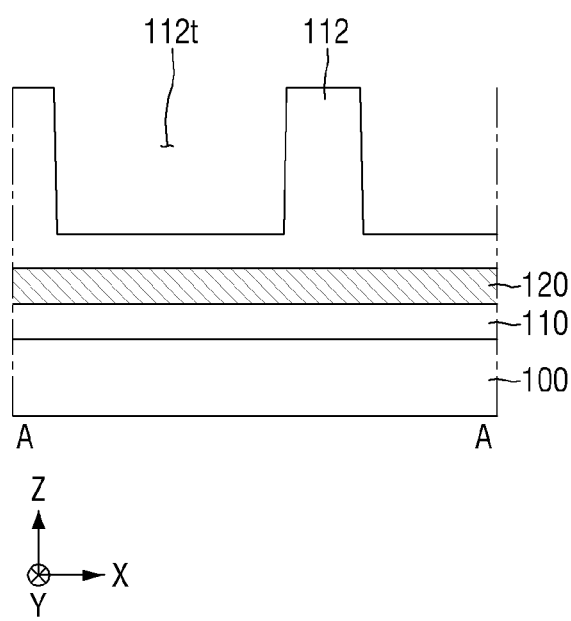

Referring to FIGS. 15 and 16, a cell trench 112*t* is formed in the first interlayer insulation film 112.

The cell trench 112*t* may extend long in the second direction Y and across the conductive line 120. The plurality of cell trenches 112*t* each extend in the second direction Y and may be spaced apart from each other at equal intervals in the first direction X. Therefore, each of the first interlayer insulation films 112 may form pin-shaped insulating patterns that extend in the second direction Y and are spaced apart from each other by the cell trench 112*t*.

Figure 17:
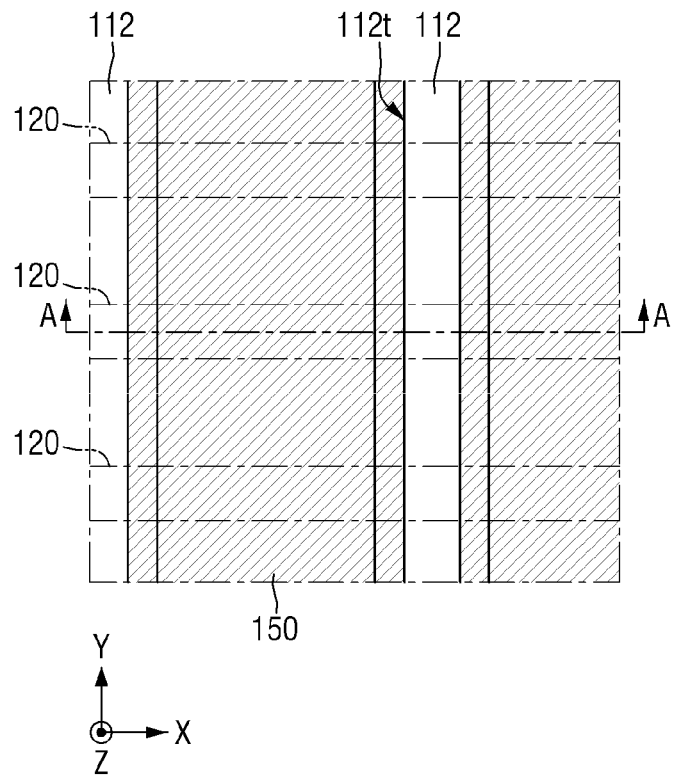
Figure 18:
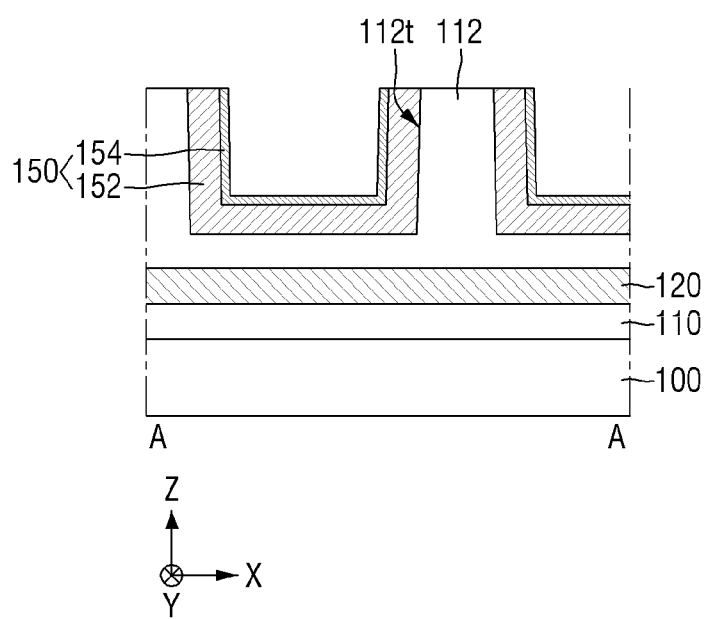

Referring to FIGS. 17 and 18, a preliminary gate electrode layer 150 is formed in the cell trench 112*t*.

The preliminary gate electrode layer 150 may extend along the lower surface and the side surfaces of the cell trench 112*t*. Also, the preliminary gate electrode layer 150 may extend long in the second direction Y and cross the conductive line 120.

In some embodiments, the preliminary gate electrode layer 150 may include a first conductive pattern 152 and a first barrier conductive film 154. The first conductive pattern 152 and the first barrier conductive film 154 may be sequentially stacked inside the cell trench 112*t*.

In some embodiments, the preliminary gate electrode layer 150 may be formed to expose the upper surface of the first interlayer insulation film 112. For example, a flattening (e.g., planarization) process of exposing the upper surface of the first interlayer insulation film 112 may be performed. The flattening process may include, but is not limited to, a chemical mechanical polishing (CMP) process.

Figure 19:
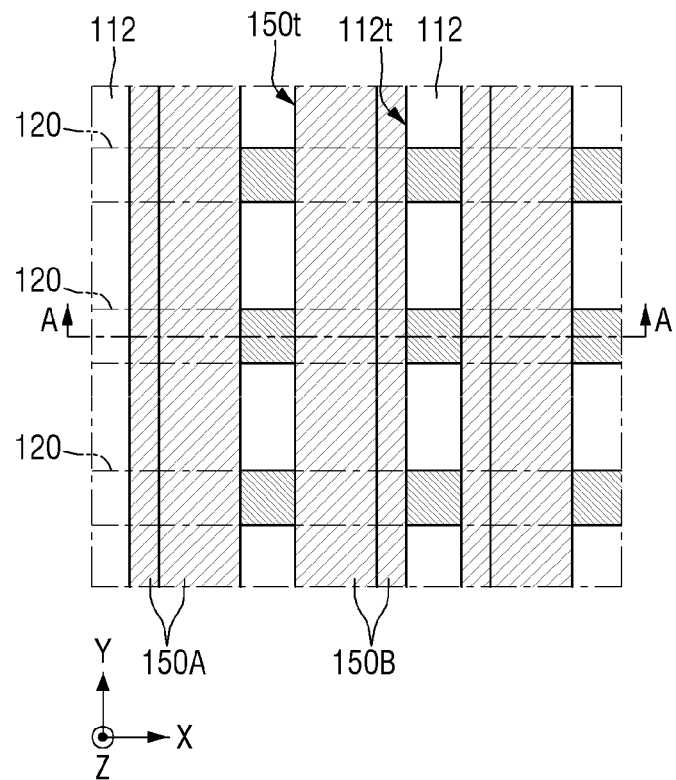
Figure 20:
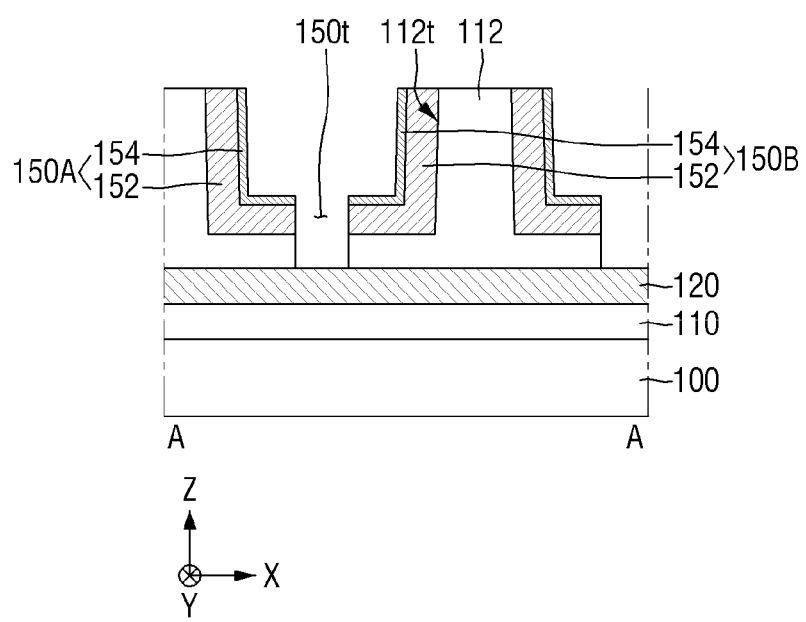

Referring to FIGS. 19 and 20, gate electrodes 150A and 150B are formed inside the cell trench 112*t*.

For example, the separation trench 150*t* may be formed in the first interlayer insulation film 112 and the preliminary gate electrode layer 150. The separation trench 150*t* may extend in the second direction Y to separate the gate electrodes 150A and 150B. As a result, the first gate electrode 150A and the second gate electrode 150B that are spaced apart from each other in the first direction X may be formed. Further, the separation trench 150*t* may expose a part of the conductive line 120. For example, the lower portion/surface of the separation trench 150*t* may overlap/expose a part of the upper surface of the conductive line 120.

Figure 21:
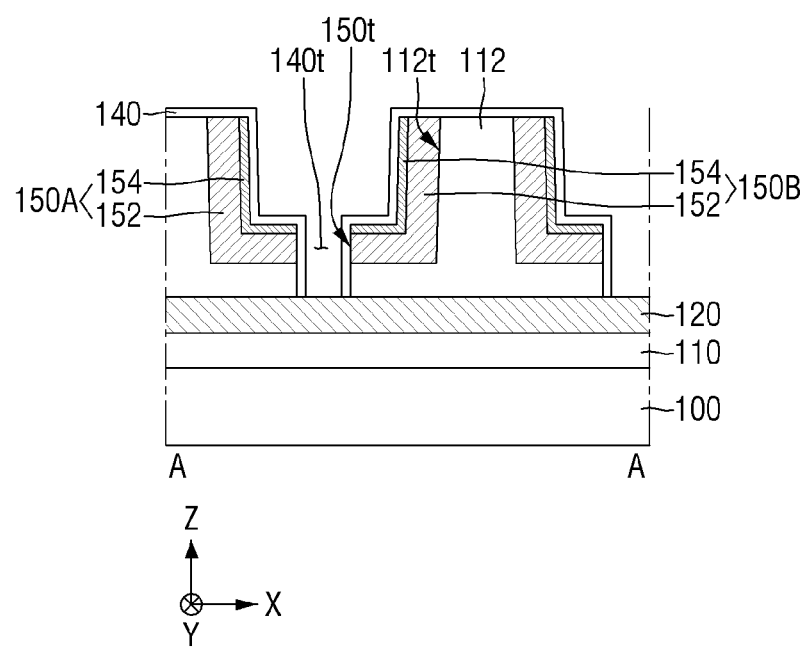

Subsequently, referring to FIG. 21, the gate insulation layer 140 is formed on the gate electrodes 150A and 150B.

The gate insulation layer 140 may be stacked on the gate electrodes 150A and 150B. For example, the gate insulation layer 140 may conformally extend along the profiles of the gate electrodes 150A and 150B, the first interlayer insulation film 112, and the separation trench 150*t*.

The gate insulation layer 140 may be patterned to expose a part of the conductive line 120. For example, the gate insulation layer 140 may include a contact trench 140*t* inside the separation trench 150*t*. A lower portion/surface of the contact trench 140*t* may overlap (e.g., expose) a part of the upper surface of the conductive line 120.

Figure 22:
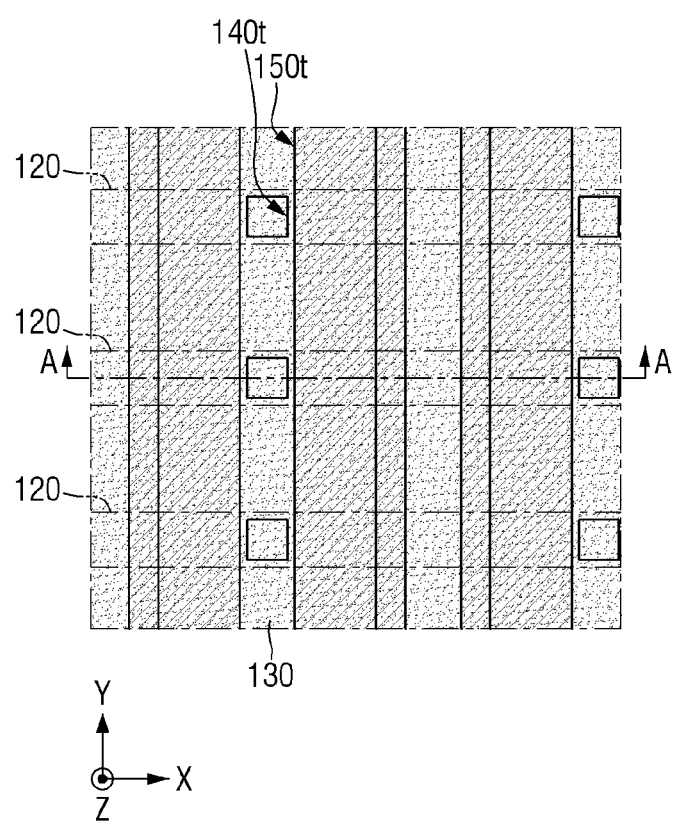
Figure 23:
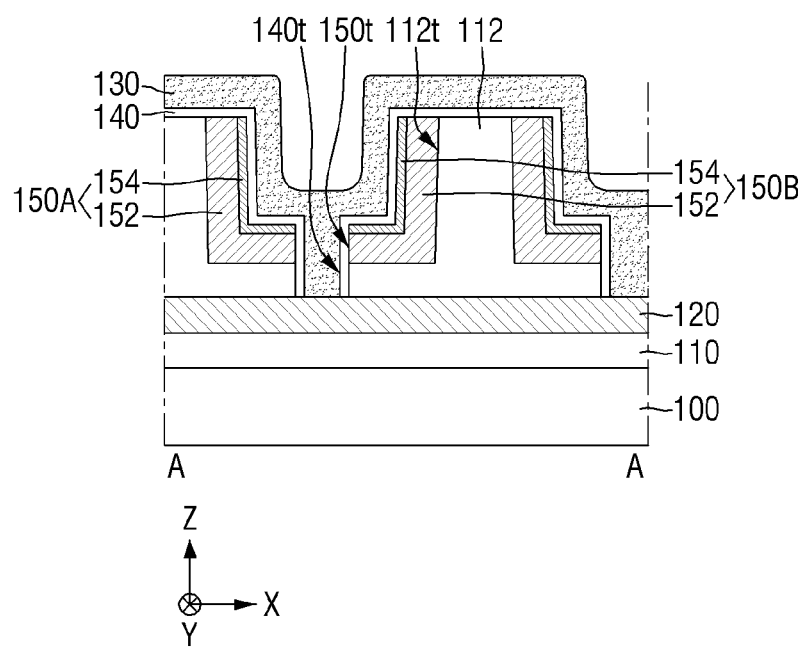

Referring to FIGS. 22 and 23, a channel layer 130 is formed on the gate insulation layer 140.

The channel layer 130 may be stacked on the gate insulation layer 140. For example, the channel layer 130 may extend along the gate electrodes 150A and 150B and the gate insulation layer 140. The channel layer 130 may be formed, but is not limited to, for example, by an atomic layer deposition (ALD) process.

The channel layer 130 may be formed in (e.g., to fill) the contact trench 140*t*. Therefore, the channel layer 130 may be electrically connected to the upper surface of the conductive line 120 by extending through the separation trench 150*t* and the contact trench 140*t*.

The channel layer 130 may include a semiconductor material. As an example, the channel layer 130 may include an oxide semiconductor material. As another example, the channel layer 130 may include silicon (Si) and germanium (Ge) as the elemental semiconductor materials or materials doped to them. Alternatively, the channel layer 130 may also include a group IV-IV compound semiconductor or a group III-V compound semiconductor. As another example, the channel layer 130 may include a two-dimensional semiconductor material. The channel layer 130 may include a single layer or multiple layers of the semiconductor material described above. Preferably, the channel layer 130 may include IGZO.

Figure 24:
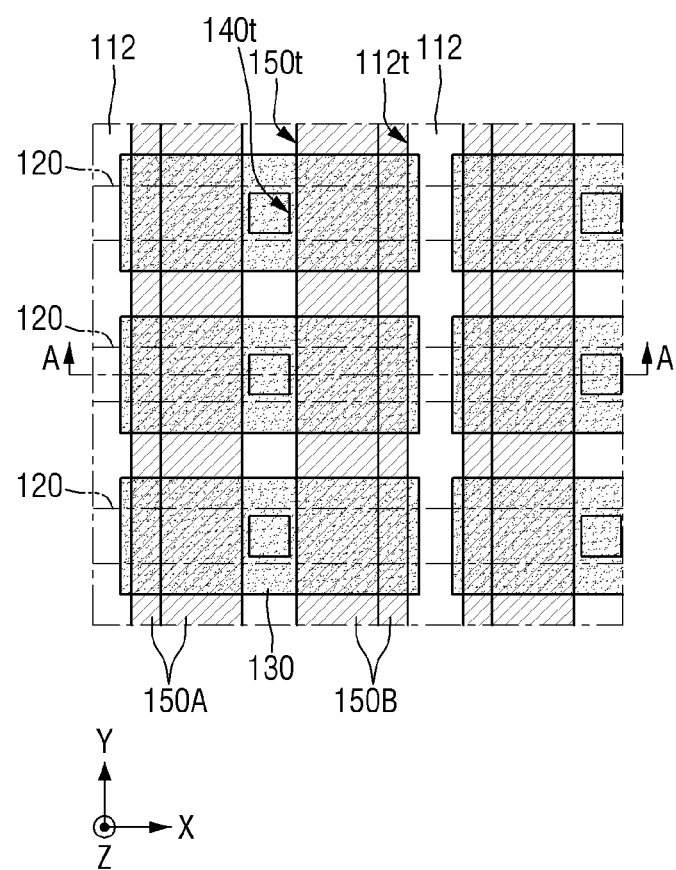
Figure 25:
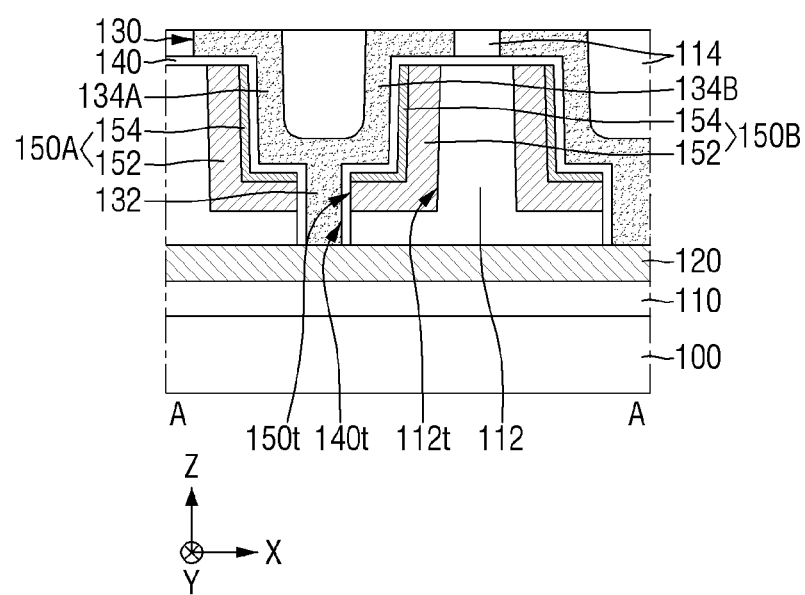

Referring to FIGS. 24 and 25, the channel layer 130 is patterned.

For example, a plurality of channel layers 130 that are spaced apart from each other in the first direction X and the second direction Y and arranged in a matrix form may be formed. Also, the channel layer 130 including the penetration portion 132, the first extension portion 134A and the second extension portion 134B may be formed.

Next, the second interlayer insulation film 114 may be formed on the channel layer 130. The second interlayer insulation film 114 may separate a plurality of channel layers 130 spaced apart from each other and arranged in the matrix form. In some embodiments, the upper surface of the second interlayer insulation film 114 may be placed at the same level as the upper surface of the channel layer 130. For example, a flattening (e.g., planarization) process of exposing the upper surface of the channel layer 130 may be performed. The flattening process may include, but is not limited to, a chemical mechanical polishing (CMP) process.

In some embodiments, the second interlayer insulation film 114 may be interposed between the first extension portion 134A and the second extension portion 134B. For example, the second interlayer insulation film 114 may be formed on the channel layer 130 to fill the cell trench 112*t*.

Figure 26:
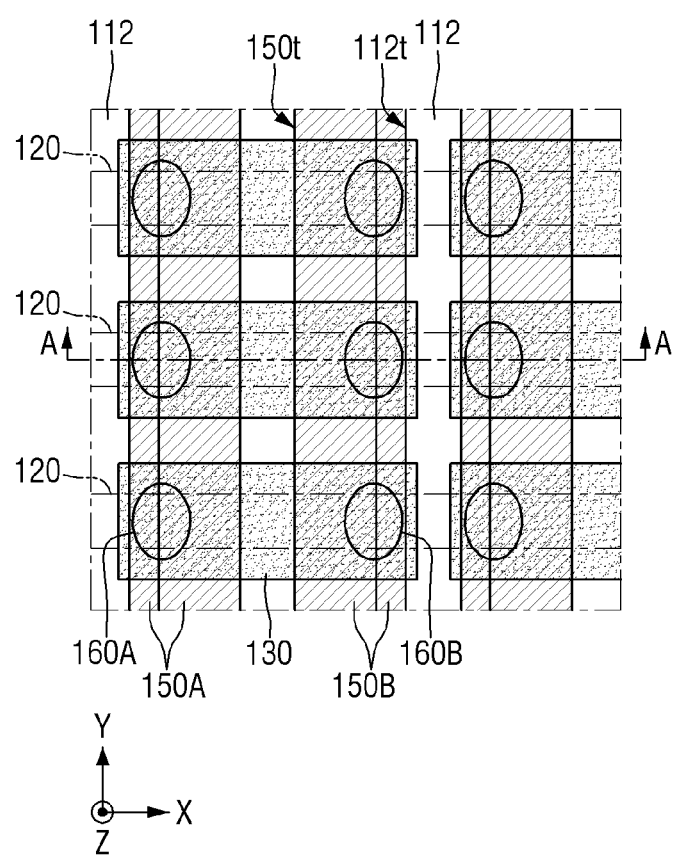
Figure 27:
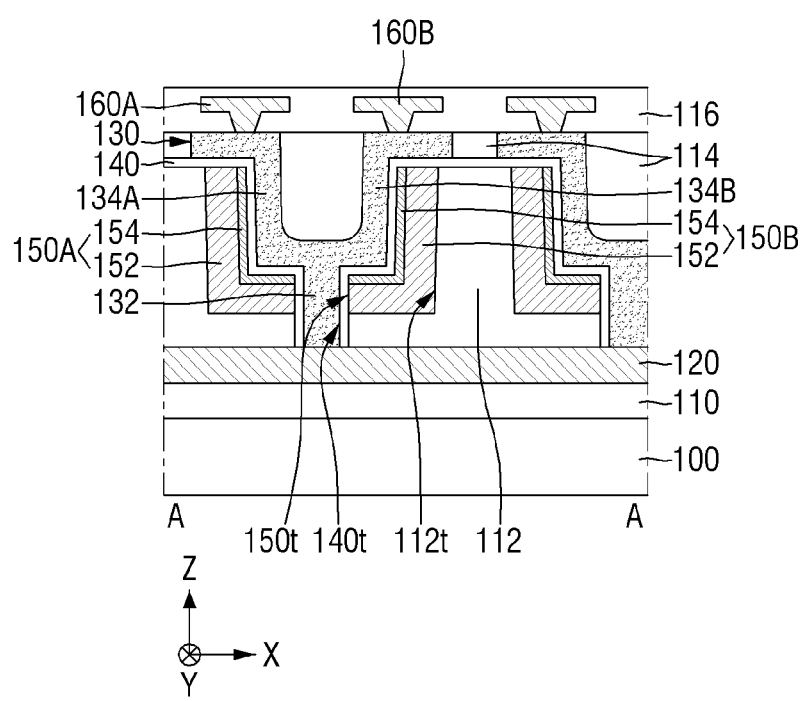

Referring to FIGS. 26 and 27, landing pads 160A and 160B are formed on the channel layer 130.

For example, a third interlayer insulation film 116 may be formed on the first interlayer insulation film 112 and the second interlayer insulation film 114. The landing pads 160A and 160B are each formed in the third interlayer insulation film 116 and may be electrically connected to the upper part of the channel layer 130.

Subsequently, referring to FIGS. 1 and 2, capacitor structures 170A and 170B are formed on the landing pads 160A and 160B.

For example, lower electrodes 173A and 173B arranged to correspond to the landing pads 160A and 160B may be formed on the landing pads 160A and 160B. Subsequently, the capacitor dielectric layer 175 and the upper electrode 178 may be sequentially formed on the lower electrodes 173A and 173B. Therefore, it is possible to provide a method for fabricating a semiconductor memory device having improved performance and reliability.

Figure 28:
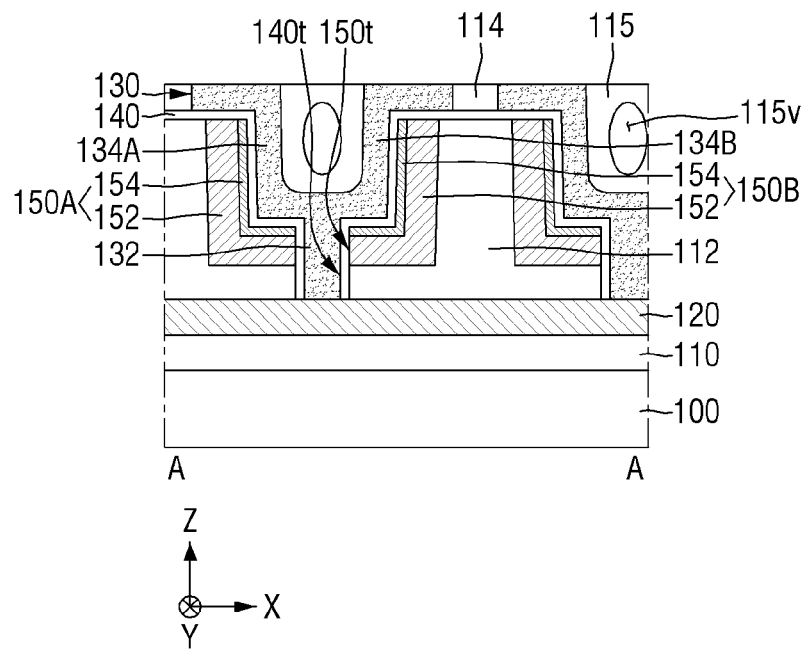
FIG. 28 is an intermediate stage diagram for explaining a method for fabricating a semiconductor memory device according to some embodiments.

FIG. 28 is an intermediate stage diagram for explaining a method for fabricating a semiconductor memory device according to some embodiments. For convenience of explanation, repeated parts of contents explained above using FIGS. 1 to 27 may be briefly described or omitted. For reference, FIG. 28 is an intermediate stage diagram for explaining a step after FIG. 25.

Referring to FIG. 28, the filling insulation film 115 is formed on the channel layer 130.

The filling insulation film 115 may be formed on the channel layer 130 to fill the cell trench 112*t*. For example, the second interlayer insulation film 114 interposed between the first extension portion 134A and the second extension portion 134B may be removed. Subsequently, the filling insulation film 115 may be formed in the region from which the second interlayer insulation film 114 is removed. In some embodiments, the filling insulation film 115 may include a low dielectric constant (low-k) material.

In some embodiments, the upper surface of the filling insulation film 115 may be placed at the same level as the upper surface of the channel layer 130. For example, a flattening (e.g., planarization) process of exposing the upper surface of the channel layer 130 may be performed. The flattening process may include, but is not limited to, a chemical mechanical polishing (CMP) process.

Subsequently, the steps described above using FIGS. 26, 27, 1 and 2 may be performed. Therefore, the method for fabricating the semiconductor memory device explained above using FIG. 4 may be provided.

Figure 29:
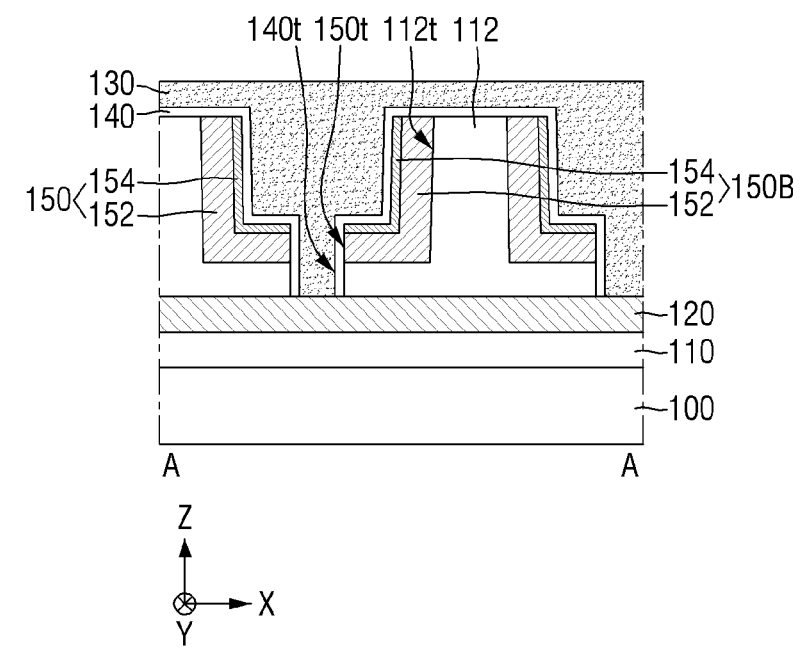
FIG. 29 is an intermediate stage diagram for explaining a method for fabricating a semiconductor memory device according to some embodiments.

FIG. 29 is an intermediate stage diagram for explaining a method for fabricating a semiconductor memory device according to some embodiments. For convenience of explanation, repeated parts of contents explained above using FIGS. 1 to 27 may be briefly described or omitted. For reference, FIG. 29 is an intermediate stage diagram for explaining a step after FIG. 21.

Referring to FIG. 29, the channel layer 130 that fills the cell trench 112*t* is formed on the gate insulation layer 140.

Subsequently, the steps explained above using FIGS. 24 to 27, 1 and 2 may be performed. Therefore, the method for fabricating the semiconductor memory device explained above using FIGS. 1 and 2 may be provided.

Figure 30:
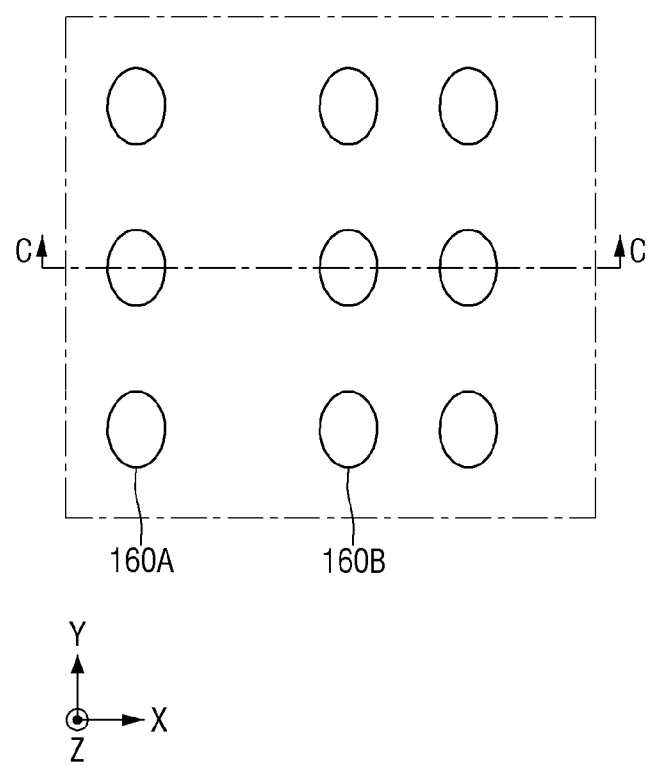
FIGS. 30 to 32 are intermediate stage diagrams for explaining a method for fabricating a semiconductor memory device according to some embodiments.
Figure 31:
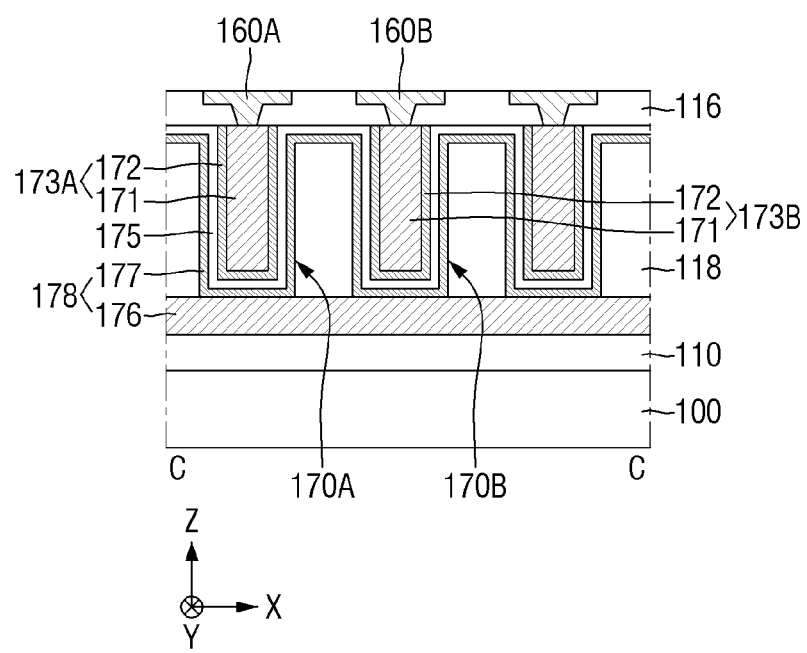
Figure 32:
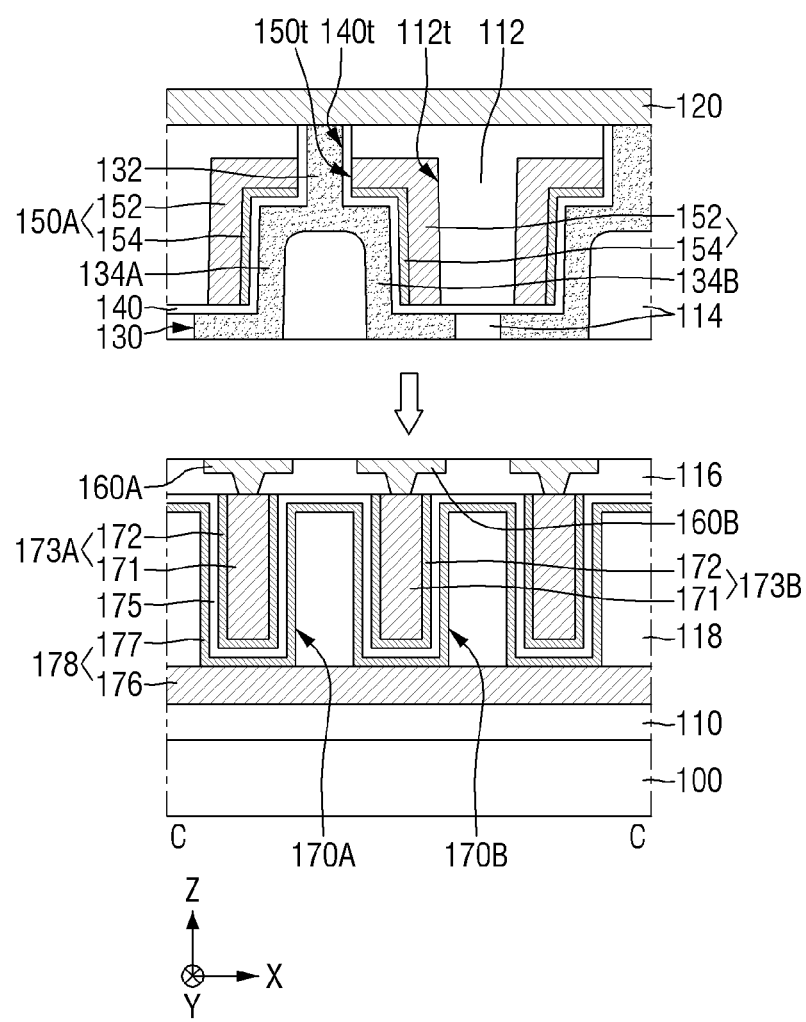

FIGS. 30 to 32 are intermediate stage diagrams for explaining a method for fabricating a semiconductor memory device according to some embodiments. For convenience of explanation, repeated parts of contents explained above using FIGS. 1 to 27 may be briefly described or omitted. For reference, FIG. 31 is a cross-sectional view taken along line C-C of FIG. 30.

Referring to FIGS. 30 and 31, the capacitor structures 170A and 170B and the landing pads 160A and 160B are formed on the first substrate 100.

For example, the third conductive pattern 176 may be formed on the lower insulation film 110. Next, the fourth interlayer insulation film 118 may be formed on the third conductive pattern 176 and the lower insulation film 110. The third barrier conductive film 177, the capacitor dielectric layer 175, and the lower electrodes 173A and 173B may be sequentially stacked on the fourth interlayer insulation film 118.

Further, the third interlayer insulation film 116 may be formed on the fourth interlayer insulation film 118. The landing pads 160A and 160B are formed in the third interlayer insulation film 116, and may be electrically connected to the upper surfaces of the lower electrodes 173A and 173B.

Referring to FIG. 32, the channel layer 130 is attached on the landing pads 160A and 160B.

The channel layer 130 may be formed, for example, in a manner similar to that explained above using FIGS. 13 to 25. Subsequently, as shown, the channel layer 130 may be provided on the landing pads 160A and 160B in an inverted form. Therefore, the method for fabricating the semiconductor memory device explained above using FIG. 7 may be provided.

While the present inventive concept has been particularly shown and described with reference to example embodiments thereof, it will be understood by those of ordinary skill in the art that various changes in form and details may be made therein without departing from the scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor memory device comprising:
 a conductive line extending in a first direction on a substrate;
 an interlayer insulation film that includes a cell trench extending in a second direction intersecting the first direction, on the substrate;
 a first gate electrode and a second gate electrode that are spaced apart from each other in the first direction and each extend in the second direction, inside the cell trench;
 a channel layer that is inside the cell trench and is electrically connected to the conductive line, on the first gate electrode and the second gate electrode; and
 a gate insulation layer interposed between the first gate electrode and the channel layer, and between the second gate electrode and the channel layer.

2. The semiconductor memory device of claim 1, wherein the channel layer includes an oxide semiconductor material.

3. The semiconductor memory device of claim 2, wherein the oxide semiconductor material includes indium gallium zinc oxide (IGZO).

4. The semiconductor memory device of claim 1, wherein each of the first gate electrode and the second gate electrode is interposed between the interlayer insulation film and the channel layer.

5. The semiconductor memory device of claim 1, wherein the channel layer includes:
 a penetration portion that penetrates the interlayer insulation film and is electrically connected to the conductive line, between the first gate electrode and the second gate electrode;
 a first extension portion extending from the penetration portion along a side surface of the first gate electrode; and
 a second extension portion extending from the penetration portion along a side surface of the second gate electrode.

6. The semiconductor memory device of claim 5,
 wherein the first extension portion and the second extension portion face each other inside the cell trench,
 wherein the first extension portion comprises a first channel region of a first transistor that includes the first gate electrode, and
 wherein the second extension portion comprises a second channel region of a second transistor that includes the second gate electrode.

7. The semiconductor memory device of claim 5,
 wherein the first extension portion further extends along an upper surface of the first gate electrode, and
 wherein the second extension portion further extends along an upper surface of the second gate electrode.

8. The semiconductor memory device of claim 5, further comprising:
an insulation film that is inside the cell trench and has a dielectric constant smaller than silicon oxide, between the first extension portion and the second extension portion.

9. The semiconductor memory device of claim 5, further comprising:
a void between the first extension portion and the second extension portion.

10. The semiconductor memory device of claim 1, further comprising:
a first capacitor structure electrically connected to a first end of the channel layer adjacent to the first gate electrode; and
a second capacitor structure electrically connected to an opposite, second end of the channel layer adjacent to the second gate electrode.

11. The semiconductor memory device of claim 10, further comprising:
a first landing pad that electrically connects the first end of the channel layer and the first capacitor structure; and
a second landing pad that electrically connects the second end of the channel layer and the second capacitor structure.

12. The semiconductor memory device of claim 1, further comprising:
a peripheral circuit element electrically connected to the conductive line, on the substrate; and
an inter-wiring insulation film that is on the peripheral circuit element,
wherein the interlayer insulation film is stacked on an upper surface of the inter-wiring insulation film.

13. A semiconductor memory device comprising:
a conductive line extending in a first direction, on a substrate;
an interlayer insulation film that includes a cell trench extending in a second direction intersecting the first direction, on the substrate;
a first gate electrode and a second gate electrode that are spaced apart from each other in the first direction and each extend in the second direction, inside the cell trench;
a separation trench that overlaps the conductive line and extends in the second direction to separate the first gate electrode and the second gate electrode;
a channel layer that extends along the first gate electrode and the second gate electrode and through the separation trench to electrically connect to the conductive line; and
a gate insulation layer interposed between the first gate electrode and the channel layer, and between the second gate electrode and the channel layer.

14. The semiconductor memory device of claim 13, wherein the channel layer includes an oxide semiconductor material.

15. The semiconductor memory device of claim 13, wherein the gate insulation layer extends along an upper surface of the interlayer insulation film and side surfaces of the separation trench.

16. The semiconductor memory device of claim 13,
wherein the gate insulation layer includes a contact trench that overlaps the conductive line in the separation trench, and
wherein the channel layer extends through the contact trench to electrically connect to the conductive line.

17. The semiconductor memory device of claim 13, wherein each of the first gate electrode and the second gate electrode includes:
a conductive pattern; and
a barrier conductive film interposed between the conductive pattern and the gate insulation layer.

18. A semiconductor memory device comprising:
a bit line extending in a first direction on a substrate;
a first interlayer insulation film that includes a cell trench extending in a second direction intersecting the first direction, on the substrate;
a first word line and a second word line that are spaced apart from each other in the first direction and each extend in the second direction, inside the cell trench;
a channel layer that is inside the cell trench, is electrically connected to the bit line, and includes an oxide semiconductor material, on the first word line and the second word line;
a gate insulation layer interposed between the first word line and the channel layer, and between the second word line and the channel layer;
a first capacitor structure electrically connected to a first end of the channel layer adjacent to the first word line; and
a second capacitor structure electrically connected to an opposite, second end of the channel layer adjacent to the second word line.

19. The semiconductor memory device of claim 18, wherein the oxide semiconductor material includes indium gallium zinc oxide (IGZO).

20. The semiconductor memory device of claim 18, wherein the channel layer includes:
a penetration portion that penetrates the first interlayer insulation film and is electrically connected to the bit line, between the first word line and the second word line;
a first extension portion extending from the penetration portion along a side surface of the first word line; and
a second extension portion extending from the penetration portion along a side surface of the second word line.

* * * * *